US009611142B2

(12) United States Patent
Hirata et al.

(10) Patent No.: US 9,611,142 B2
(45) Date of Patent: Apr. 4, 2017

(54) METHOD FOR MANUFACTURING ELECTRONIC COMPONENT

(71) Applicant: SUMITOMO PRECISION PRODUCTS CO., LTD., Hyogo (JP)

(72) Inventors: Yasuyuki Hirata, Hyogo (JP); Gen Matsuoka, Hyogo (JP)

(73) Assignee: Sumitomo Precision Products Co., Ltd., Hyogo (JP)

( * ) Notice: Subject to any disclaimer, the term of this patent is extended or adjusted under 35 U.S.C. 154(b) by 0 days.

(21) Appl. No.: 15/077,188

(22) Filed: Mar. 22, 2016

(65) Prior Publication Data
US 2016/0200569 A1 Jul. 14, 2016

Related U.S. Application Data

(63) Continuation of application No. PCT/JP2014/005609, filed on Nov. 7, 2014.

(30) Foreign Application Priority Data

Nov. 7, 2013 (JP) .................. 2013-231045

(51) Int. Cl.
H01L 21/31 (2006.01)
B81C 1/00 (2006.01)
(Continued)

(52) U.S. Cl.
CPC ........ *B81C 1/00492* (2013.01); *B81B 3/0086* (2013.01); *B81C 1/00404* (2013.01);
(Continued)

(58) Field of Classification Search
CPC ......... H01L 21/76801; H01L 21/31612; H01L 21/02274; H01L 21/3105; H01L 21/6835;
(Continued)

(56) References Cited

U.S. PATENT DOCUMENTS

2006/0057761 A1   3/2006   Mi et al.
2007/0287231 A1  12/2007   Chung et al.
(Continued)

FOREIGN PATENT DOCUMENTS

JO   2012-166313 A      9/2012
JP   2010-107628 A      5/2010
WO   WO 2004/103892 A1 12/2004

OTHER PUBLICATIONS

International Search Report for corresponding International Application No. PCT/JP2014/005609 mailed Dec. 9, 2014.
(Continued)

*Primary Examiner* — Thinh T Nguyen
(74) *Attorney, Agent, or Firm* — Renner, Otto, Boisselle & Sklar, LLP

(57) ABSTRACT

At the first etching step of etching an SOI substrate from a first silicon layer side, a portion of a first structure formed of the first silicon layer is formed as a pre-structure having a larger shape than a final shape. At the mask formation step of forming a final mask on a second silicon layer side of the SOI substrate, a first mask corresponding to the final shape of the first structure is formed in the pre-structure. At the second etching step of etching the SOI substrate from the second silicon layer side, the second silicon layer and the pre-structure are, using the first mask, etched to form the final shape of the first structure.

10 Claims, 18 Drawing Sheets

(51) Int. Cl.
*G02B 26/08* (2006.01)
*B81B 3/00* (2006.01)
(52) U.S. Cl.
CPC ...... *B81C 1/00603* (2013.01); *G02B 26/0841* (2013.01); *B81B 2201/042* (2013.01); *B81B 2203/0136* (2013.01); *B81C 2201/0102* (2013.01); *B81C 2201/0132* (2013.01); *B81C 2201/0198* (2013.01)
(58) Field of Classification Search
CPC ..... H01L 21/687; H01L 29/00; C23C 16/402; H02N 1/006; H01G 5/16
USPC ........ 438/761, 751, 736, 737, 738; 257/415, 257/413, 417, E21.211, E21.176, E21.002
See application file for complete search history.

(56) References Cited

U.S. PATENT DOCUMENTS

2010/0103492 A1    4/2010  Maruyama et al.
2012/0250129 A1*  10/2012  Nakatani ............ G02B 26/0841
                                                             359/200.6

OTHER PUBLICATIONS

Form PCT/ISA/237 for corresponding International Application No. PCT/JP2014/005609 dated Dec. 9, 2014.

* cited by examiner

METHOD FOR MANUFACTURING ELECTRONIC COMPONENT

CROSS-REFERENCE TO RELATED APPLICATIONS

This is a continuation of International Application No. PCT/JP2014/005609 filed on Nov. 7, 2014, which claims priority to Japanese Patent Application No. 2013-231045 filed on Nov. 7, 2013. The entire disclosures of these applications are incorporated by reference herein.

BACKGROUND

The technique disclosed herein relates to the method for manufacturing an electronic component.

Typically, an electronic component including structures formed of a substrate with a plurality of layers has been known. For example, Patent Document 1 (Japanese Unexamined Patent Publication No. 2010-107628) discloses an MEMS mirror. The MEMS mirror includes a mirror plate, a spring, a movable comb, a fixed comb, etc., and is formed of a substrate with a plurality of silicon layers.

For the MEMS mirror of Patent Document 1, a silicon-on-insulator (SOI) substrate is first processed such that, e.g., the mirror plate, the spring, and the movable comb are formed. Subsequently, another substrate is joined to the SOI substrate, and is processed such that the fixed comb is formed. The MEMS mirror is manufactured by several other steps.

However, in the case where each structure is manufactured using a substrate with a plurality of layers, such a manufacturing method is not limited to the method of Patent Document 1. For example, the substrate with the plurality of layers is processed from one side thereof, and then, is processed from the other side thereof. In such a manufacturing method, a single structure might be formed by processing from each side of the substrate. In this case, if positional misalignment between the portion processed from one side and the portion processed from the other side is caused, the structure cannot be precisely formed.

SUMMARY

The technique disclosed herein has been made in view of the above-described points, and is intended to precisely form a structure even in the case where the structure is formed by processing of a substrate from each side thereof.

The technique disclosed herein is intended for the method for manufacturing an electronic component, in which a substrate including at least first and second layers is etched to form a structure. This electronic component manufacturing method includes the first etching step of etching the substrate from the first layer side, the mask formation step of forming a mask on the second layer side of the substrate, and the second etching step of etching, using the mask, the substrate from the second layer side. At the first etching step, a portion of the structure formed of the first layer is formed as a pre-structure having a larger shape than a final shape. At the mask formation step, a mask corresponding to the final shape is formed on the second layer side of the substrate in the pre-structure as viewed in the thickness direction of the substrate. At the second etching step, the second layer and the pre-structure are, using the mask corresponding to the final shape, etched to form the final shape.

The mask formation step is not necessarily performed after the first etching step, and may be performed before the first etching step. Moreover, the "final shape" means the shape of the structure after the second etching step. Even if any treatment or processing is performed for the structure after the second etching step, the "final shape" does not mean the shape after such treatment or processing. Further, the phrase of etching using the mask is not limited to the case of etching using the mask itself, and also indicates the case of etching using another mask formed using the mask.

BRIEF DESCRIPTION OF THE DRAWINGS

FIG. 5A illustrates the step of etching a portion of the $SiO_2$ film with a first resist mask. FIG. 5B illustrates the step of forming an Au/Ti/Pt film. FIG. 5C illustrates the step of removing the Au/Ti/Pt film from the $SiO_2$ film.

FIG. 6A illustrates the step of forming a second resist mask. FIG. 6B illustrates the step of etching a first silicon layer. FIG. 6C illustrates the step of etching an oxide layer from a first silicon layer side.

FIG. 10A illustrates the step of forming a fourth resist mask. FIG. 10B illustrates the step of etching the $SiO_2$ film.

FIG. 11A illustrates the step of placing a photomask. FIG. 11B illustrates the step of forming the fifth resist mask. FIG. 11C illustrates the step of forming an oxide mask.

FIG. 12A illustrates the step of etching the second silicon layer. FIG. 12B illustrates the step of etching the oxide layer.

FIG. 13A illustrates the step of detaching the fourth resist mask. FIG. 13B illustrates the step of etching an unnecessary portion of the first and second silicon layers.

FIG. 16A illustrates the state in which a photomask is displaced. FIG. 16B illustrates the state in which the fourth resist mask is displaced. FIG. 16C illustrates the state in which the final mask is displaced.

FIG. 17A illustrates the state in which the second silicon layer and the oxide layer are etched. FIG. 17B illustrates the state in which an unnecessary portion of the first and second silicon layers is etched.

DETAILED DESCRIPTION

An example embodiment will be described below in detail with reference to drawings.

Figure 1:
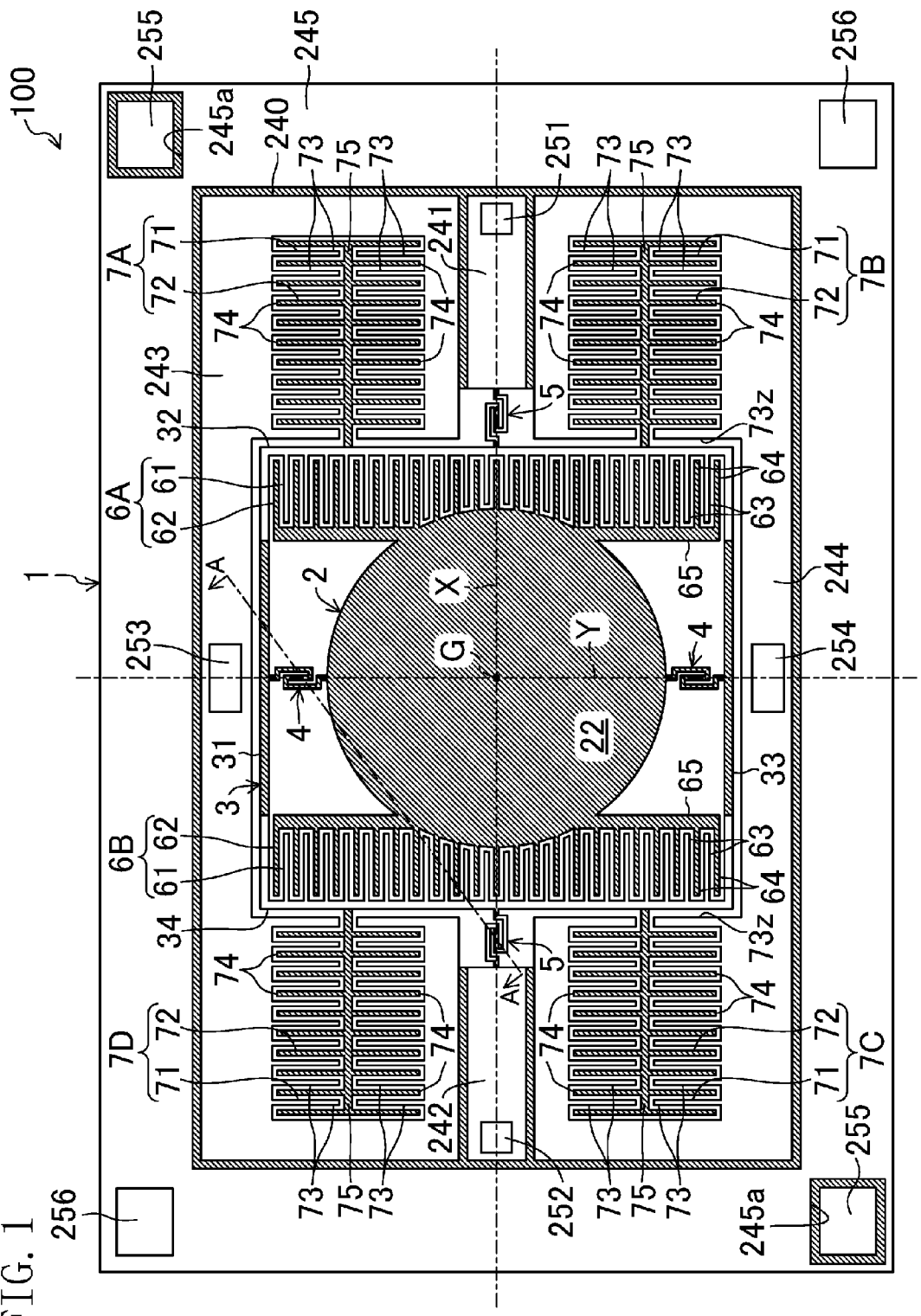
FIG. 1 is a plan view of a mirror device.
Figure 2:
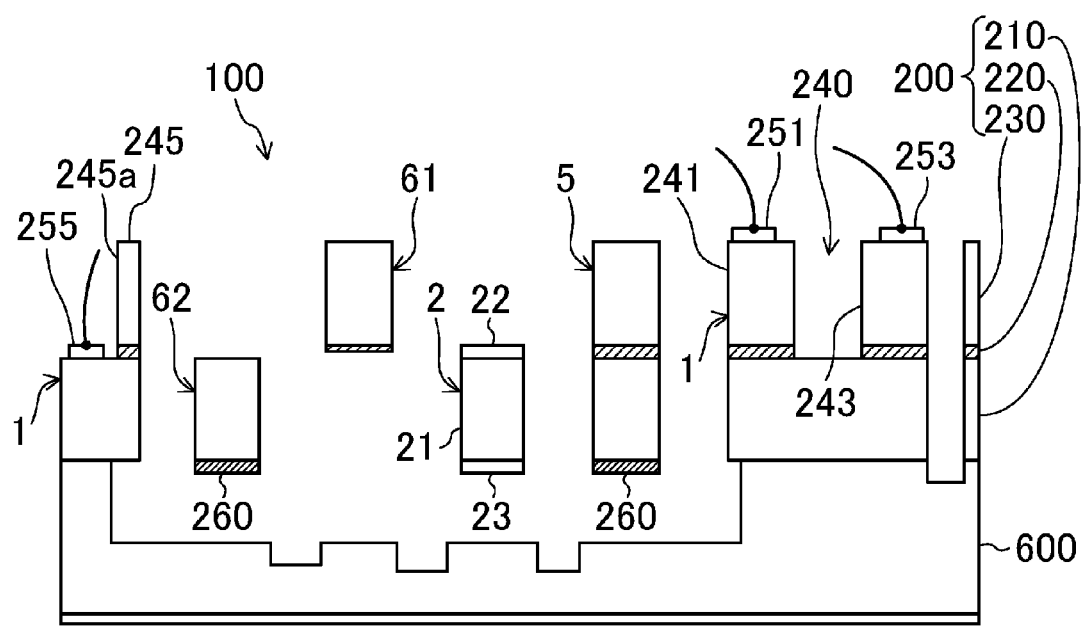
FIG. 2 is a schematic cross-sectional view of the mirror device.

FIG. 1 is a plan view of a mirror device 100, and FIG. 2 is a schematic cross-sectional view of the mirror device 100. Note that FIG. 2 schematically illustrates, as an cross-sectional view, some structures of the mirror device 100. For this reason, the shape and the positional relationship of the structures are not precisely illustrated in FIG. 2.

[Configuration of Mirror Device]

The mirror device 100 includes a frame-shaped base 1, a mirror 2, a frame body 3, first hinges 4 each connecting between the mirror 2 and the frame body 3, second hinges 5 each connecting between the frame body 3 and the base 1, first and second inner drive electrodes 6A, 6B each configured to drive the mirror 2 on the frame body 3, first to fourth outer drive electrodes 7A to 7D each configured to drive the frame body 3 on the base 1, and a controller (not shown) configured to control tilting of the mirror 2. The mirror device 100 is configured to tilt the mirror 2 about a main axis X and a sub-axis Y orthogonal to each other. The mirror device 100 is an example of an electronic component.

As illustrated in FIG. 2, the mirror device 100 is manufactured using a silicon-on-insulator (SOI) substrate 200. The SOI substrate 200 is configured such that a first silicon layer 210 made of silicon, an oxide layer 220 made of $SiO_2$, and a second silicon layer 230 made of silicon are stacked on each other in this order. Note that in FIG. 1, the portion formed of the second silicon layer 230 and being visible as viewed in the plane is hatched. Although a later-described mirrored surface layer 22 is provided on the mirror 2, such a portion is hatched in FIG. 1.

The base 1 is formed in a substantially rectangular frame shape. A substantially square opening is formed substantially at the center of the base 1. The axis extending parallel to the long side of the base 1 and passing the gravity center G of the mirror 2 is the X-axis, and the axis extending parallel to the short side of the base 1 and passing the gravity center G of the mirror 2 is the Y-axis. A major portion of the base 1 is formed of the first silicon layer 210, the oxide layer 220, and the second silicon layer 230.

The frame body 3 is formed in a substantially square frame shape. The frame body 3 is placed in the opening formed substantially at the center of the base 1. A substantially square opening is formed substantially at the center of the frame body 3. The frame body 3 includes first and third side portions 31, 33 extending parallel to the X-axis, and second and fourth side portions 32, 34 extending parallel to the Y-axis. Of each of the first side portion 31 and the third side portion 33, a portion (hereinafter referred to as an "intermediate portion") other than both end portions is formed of the first silicon layer 210. Both end portions of each of the first and third side portions 31, 33 are formed of the first silicon layer 210, the oxide layer 220, and the second silicon layer 230. Moreover, the second side portion 32 and the fourth side portion 34 are formed of the first silicon layer 210, the oxide layer 220, and the second silicon layer 230.

The mirror 2 is formed in a substantially circular plate shape. As illustrated in FIG. 2, the mirror 2 includes a mirror body 21, the mirrored surface layer 22 stacked on the front surface of the mirror body 21, and a mirrored surface layer 23 stacked on the back surface of the mirror body 21. The mirror body 21 is formed of the first silicon layer 210. The mirrored surface layers 22, 23 are formed of Au/Ti/Pt films. The mirrored surface layer 23 has the function of balancing film stress caused at the surface of the mirror body 21 due to the mirrored surface layer 22. With this configuration, the flatness of the mirror body 21 and the flatness of the mirrored surface layer 22 can be improved.

The first hinges 4 are provided to face each other with respect to the gravity center G of the mirror 2. Specifically, the first hinges 4 are arranged respectively at peripheral edge portions of the mirror 2 on the Y-axis. A first end of each first hinge 4 is connected to the mirror 2, and a second end of each first hinge 4 is connected to the frame body 3. One of the first hinges 4 is connected to the substantially middle of the first side portion 31 of the frame body 3 in the longitudinal direction of the first side portion 31. The other first hinge 4 is connected to the substantially middle of the third side portion 33 of the frame body 3 in the longitudinal direction of the third side portion 33. Each first hinge 4 extends to meander between the mirror 2 and a corresponding one of the first and third side portions 31, 33 of the frame body 3. With this configuration, each first hinge 4 is easily deformable. The first hinges 4 are formed of the first silicon layer 210.

The second hinges 5 are provided to face each other with respect to the gravity center G of the mirror 2. Specifically, the second hinges 5 are arranged respectively at peripheral edge portions of the frame body 3 on the X-axis. That is, the first hinges 4 and the second hinges 5 are alternately arranged every 90 degrees about the gravity center G of the mirror 2. A first end of each second hinge 5 is connected to the frame body 3, and a second end of each second hinge 5 is connected to the base 1. One of the second hinges 5 is connected to the substantially middle of the second side portion 32 of the frame body 3 in the longitudinal direction of the second side portion 32. The other second hinge 5 is connected to the substantially middle of the fourth side portion 34 of the frame body 3 in the longitudinal direction of the fourth side portion 34. Each second hinge 5 extends to meander between the base 1 and a corresponding one of the second and fourth side portions 32, 34 of the frame body 3. With this configuration, each second hinge 5 is easily deformable. The second hinges 5 are formed of the first silicon layer 210, the oxide layer 220, and the second silicon layer 230.

The first and second inner drive electrodes 6A, 6B are provided respectively at two points inside the frame body 3. Specifically, the first inner drive electrode 6A is provided at the second side portion 32 of the frame body 3 and a portion of the mirror 2 facing the second side portion 32. The second inner drive electrode 6B is provided at the fourth side portion 34 of the frame body 3 and a portion of the mirror 2 facing the fourth side portion 34. When the inner drive electrodes 6A, 6B are not distinguished from each other, each of the inner drive electrodes 6A, 6B is hereinafter simply referred to as an "inner drive electrode 6." Since the first inner drive electrode 6A and the second inner drive electrode 6B have the same configuration, only the configuration of the first inner drive electrode 6A will be described below.

The first inner drive electrode 6A includes a fixed inner comb electrode 61 and a movable inner comb electrode 62. The fixed inner comb electrode 61 is provided at the second side portion 32 of the frame body 3. The movable inner comb electrode 62 is provided at a portion of the mirror 2 facing the second side portion 32. The fixed inner comb electrode 61 is an example of a first comb electrode, and the movable inner comb electrode 62 is an example of a second comb electrode.

The fixed inner comb electrode 61 includes a plurality of electrode fingers 63 extending from the second side portion 32 toward the mirror 2. The electrode fingers 63 extend parallel to the X-axis direction, and are arranged at predetermined intervals in the Y-axis direction. The electrode fingers 63 are formed of the second silicon layer 230.

The movable inner comb electrode 62 includes a plurality of electrode fingers 64 extending outward from the mirror 2. The electrode fingers 64 extend parallel to the X-axis direction, and are arranged at predetermined intervals in the Y-axis direction. Some of the electrode fingers 64 are provided at an extension 65 extending from the mirror 2 in parallel with the Y-axis. As viewed in the plane, each electrode finger 64 is interposed between adjacent two of the electrode fingers 63. That is, each electrode finger 63 is interposed between adjacent two of the electrode fingers 64 as viewed in the plane. Note that the electrode fingers 64 are formed of the first silicon layer 210. Thus, when no voltage is applied to the first inner drive electrode 6A, the electrode fingers 63 and the electrode fingers 64 are displaced from each other in the thickness direction (the direction perpendicular to the X-axis and the Y-axis) of the mirror device 100, and do not face each other.

Since the electrode fingers 64 are formed of the first silicon layer 210, the electrode fingers 64 are in electrical conduction with the frame body 3 via the mirror 2 and the first hinges 4. Moreover, since the electrode fingers 63 are provided at the frame body 3, the electrode fingers 63 are also in electrical conduction with the frame body 3. However, portions (i.e., the intermediate portions of the first side portion 31 and the third side portion 33) of the frame body 3 connected respectively to the first hinges 4 are formed of the first silicon layer 210, and the electrode fingers 63 extend only from the second silicon layer 230 forming the second and fourth side portions 32, 34 of the frame body 3. That is, the electrode fingers 63 and the electrode fingers 64 are insulated from each other via the oxide layer 220 of the frame body 3.

The first to fourth outer drive electrodes 7A to 7D are provided respectively at four points outside the frame body 3. Specifically, the first and second outer drive electrodes 7A, 7B are provided respectively at both end portions of the second side portion 32 of the frame body 3. The third and fourth outer drive electrodes 7C, 7D are provided respectively at both end portions of the fourth side portion 34 of the frame body 3. When the outer drive electrodes 7A to 7D are not distinguished from each other, each of the outer drive electrodes 7A to 7D is hereinafter simply referred to as an "outer drive electrode 7." Since the first to fourth outer drive electrodes 7A to 7D have the same configuration, only the configuration of the first outer drive electrode 7A will be described below.

The first outer drive electrode 7A includes a fixed outer comb electrode 71 and a movable outer comb electrode 72. The fixed outer comb electrode 71 is provided at a recess formed at the position of the base 1 facing the end portion of the second side portion 32. The movable outer comb electrode 72 is provided at the second side portion 32 of the frame body 3. The fixed outer comb electrode 71 is an example of the first comb electrode, and the movable inner comb electrode 62 is an example of the second comb electrode.

The fixed outer comb electrode 71 includes a plurality of electrode fingers 73. The recess of the base 1 is formed in a rectangular shape. The electrode fingers 73 extend inward from two sides, extending parallel to the X-axis, of the recess in parallel with the Y-axis. The electrode fingers 73 provided on each side are arranged at predetermined intervals in the X-axis direction. The electrode fingers 73 are formed of the second silicon layer 230. Of the electrode fingers 73, the electrode finger 73 (hereinafter referred to as an "end electrode finger 73z") closest to the frame body 3 is formed thicker than the width (the dimension in the X-axis direction) of other electrode fingers 73. With this configuration, bending of the end electrode finger 73z is reduced. That is, each of the electrode fingers 73 other than the end electrode finger 73z is placed between adjacent two of electrode fingers 74 as viewed in the plane. On the other hand, the end electrode finger 73z is adjacent to the single electrode finger 74 as viewed in the plane, and is not sandwiched between adjacent two of the electrode fingers 74. Thus, when electrostatic attractive force is generated between the electrode finger 73 and the electrode finger 74 (the details will be described later), electrostatic attractive force is generated on both sides of each of the electrode fingers 73 other than the end electrode finger 73z, and is generated only on one side of the end electrode finger 73z facing the electrode finger 74. That is, each of the electrode fingers 73 other than the end electrode finger 73z is pulled by adjacent two of the electrode fingers 74, and therefore, does not bend toward either one of the electrode fingers 74. The end electrode finger 73z is pulled toward one side facing the electrode finger 74. For this reason, the end electrode finger 73z is formed thicker than the other electrode fingers 73, and therefore, bending of the end electrode finger 73z is reduced.

The movable outer comb electrode 72 includes the electrode fingers 74. An extension 75 extending outward of the frame body 3 in parallel with the X-axis is provided at the second side portion 32 of the frame body 3. The electrode fingers 74 extend from the extension 75 toward both sides of the extension 75 in parallel with the Y-axis, and are arranged at predetermined intervals in the X-axis direction. As viewed in the plane, each electrode finger 74 is interposed between adjacent two of the electrode fingers 73. That is, each electrode finger 73 is interposed between adjacent two of the electrode fingers 74 as viewed in the plane. Note that the electrode fingers 74 are formed of the first silicon layer 210. Thus, when no voltage is applied to the first outer drive electrode 7A, the electrode fingers 73 and the electrode fingers 74 are displaced from each other in the thickness direction of the mirror device 100, and do not face each other.

The electrode fingers 73 are formed of the second silicon layer 230 of the base 1, and the electrode fingers 74 are formed of the first silicon layer 210 of the frame body 3. Thus, the electrode fingers 73 and the electrode fingers 74 are insulated from each other via the oxide layer 220.

The fixed inner comb electrode 61 and the movable outer comb electrode 72 are provided at each of the second and fourth side portions 32, 34 of the frame body 3. However, the fixed inner comb electrode 61 is formed of the second silicon layer 230, and the movable outer comb electrode 72 is formed of the first silicon layer 210. For this reason, the fixed inner comb electrode 61 and the movable outer comb electrode 72 are insulated from each other via the oxide layer 220 of the frame body 3.

A portion of the base 1 formed of the second silicon layer 230 is, by an insulation groove 240, divided into several regions electrically insulated from each other. Specifically, the portion of the base 1 formed of the second silicon layer 230 includes the following regions: a first region 241 which is in electrical conduction with the fixed inner comb electrode 61 of the first inner drive electrode 6A via one of the second hinges 5; a second region 242 which is in electrical conduction with the fixed inner comb electrode 61 of the second inner drive electrode 6B via the other second hinge 5; a third region 243 which is in electrical conduction with the fixed outer comb electrode 71 of the first outer drive electrode 7A and the fixed outer comb electrode 71 of the fourth outer drive electrode 7D; a fourth region 244 which is in electrical conduction with the fixed outer comb electrode 71 of the second outer drive electrode 7B and the fixed outer comb electrode 71 of the third outer drive electrode 7C; and a frame-shaped fifth region 245 positioned on the outermost side.

A first drive electrode 251 is provided in the first region 241. The first drive electrode 251 is in electrical conduction with the fixed inner comb electrode 61 of the first inner drive electrode 6A via the second hinge 5. Moreover, a second drive electrode 252 is provided in the second region 242. The second drive electrode 252 is in electrical conduction with the fixed inner comb electrode 61 of the second inner drive electrode 6B via the second hinge 5.

A third drive electrode 253 is provided in the third region 243. The third drive electrode 253 is in electrical conduction with the fixed outer comb electrode 71 of the first outer drive electrode 7A and the fixed outer comb electrode 71 of the fourth outer drive electrode 7D. Moreover, a fourth drive electrode 254 is provided in the fourth region 244. The fourth drive electrode 254 is in electrical conduction with the fixed outer comb electrode 71 of the second outer drive electrode 7B and the fixed outer comb electrode 71 of the third outer drive electrode 7C.

Openings 245a are formed respectively at two of four corners of the fifth region 245, the two corners being on a diagonal line. Each opening 245a penetrates the second silicon layer 230 and the oxide layer 220. A common electrode 255 is provided on the first silicon layer 210 exposed through each opening 245a. Moreover, dummy electrodes 256 are provided respectively at the remaining two corners of the fifth region 245, the remaining two corners being formed without the openings 245a. Each dummy electrode 256 is provided on the second silicon layer 230.

[Operation of Mirror Device]

Operation of the mirror device 100 configured as described above will be described.

The controller is configured to apply drive voltage to the first to fourth drive electrodes 251 to 254 to tilt the mirror 2.

The controller applies the drive voltage to the first drive electrode 251 or the second drive electrode 252 to tilt the mirror 2 about the Y-axis. On the other hand, the controller applies the drive voltage to the third drive electrode 253 or the fourth drive electrode 254 to tilt the mirror 2 about the X-axis.

Specifically, before application of the drive voltage, the fixed inner comb electrode 61 and the movable inner comb electrode 62 in the inner drive electrode 6 are displaced from each other in the thickness direction of the mirror device 100, and the fixed outer comb electrode 71 and the movable outer comb electrode 72 in the outer drive electrode 7 are displaced from each other in the thickness direction of the mirror device 100. When the drive voltage is applied to the first drive electrode 251 in this state, electrostatic attractive force is generated between the fixed inner comb electrode 61 and the movable inner comb electrode 62 in the first inner drive electrode 6A. With such electrostatic attractive force, the fixed inner comb electrode 61 attracts the movable inner comb electrode 62. As a result, the mirror 2 tilts about the Y-axis such that the movable inner comb electrode 62 of the first inner drive electrode 6A is lifted up. On the other hand, when the drive voltage is applied to the second drive electrode 252, electrostatic attractive force is generated between the fixed inner comb electrode 61 and the movable inner comb electrode 62 in the second inner drive electrode 6B. With such electrostatic attractive force, the fixed inner comb electrode 61 attracts the movable inner comb electrode 62. As a result, the mirror 2 tilts about the Y-axis such that the movable inner comb electrode 62 of the second inner drive electrode 6B is lifted up. Moreover, when the drive voltage is applied to the third drive electrode 253, electrostatic attractive force is generated between the fixed outer comb electrode 71 and the movable outer comb electrode 72 in the first outer drive electrode 7A and between the fixed outer comb electrode 71 and the movable outer comb electrode 72 in the fourth outer drive electrode 7D. With such electrostatic attractive force, the fixed outer comb electrode 71 attracts the movable outer comb electrode 72. As a result, the mirror 2 tilts about the X-axis such that the movable outer comb electrode 72 of the first outer drive electrode 7A and the movable outer comb electrode 72 of the fourth outer drive electrode 7D are lifted up. On the other hand, when the drive voltage is applied to the fourth drive electrode 254, electrostatic attractive force is generated between the fixed outer comb electrode 71 and the movable outer comb electrode 72 in the second outer drive electrode 7B and between the fixed outer comb electrode 71 and the movable outer comb electrode 72 in the third outer drive electrode 7C. With such electrostatic attractive force, the fixed outer comb electrode 71 attracts the movable outer comb electrode 72. As a result, the mirror 2 tilts about the X-axis such that the movable outer comb electrode 72 of the second outer drive electrode 7B and the movable outer comb electrode 72 of the third outer drive electrode 7C are lifted up.

The amount of tilting of the mirror 2 can be detected in such a manner that the mirror 2 is irradiated with light, and then, the reflected light from the mirror 2 is detected by, e.g., a photo detector. The controller feeds back the tilting amount of the mirror 2 detected as described above to adjust the drive voltage to be applied to the first to fourth drive electrodes 251 to 254. In this manner, tilting of the mirror 2 is controlled.

[Method for Manufacturing Mirror Device]

The method for manufacturing the mirror device 100 will be described.

The mirror device 100 includes a first structure formed of the first silicon layer 210 and the second silicon layer 230, a second structure not including the first silicon layer 210 and formed of the second silicon layer 230, and a third structure not including the second silicon layer 230 and formed of the first silicon layer 210. Note that the structures are categorized according to the first silicon layer 210 and the second silicon layer 230, and therefore, each structure may or may not include the oxide layer 220. For example, the first structure of the present embodiment includes the oxide layer 220. In the present embodiment, the base 1, a portion (both end portions of the first side portion 31, both end portions of the third side portion 33, the second side portion 32, and the fourth side portion 34) of the frame body 3, and the second hinges 5 are the first structures. The fixed inner comb electrode 61 and the fixed outer comb electrode 71 are the second structures. The mirror 2, a portion (the intermediate portion of the first side portion 31 and the intermediate portion of the third side portion 33) of the frame body 3, the first hinges 4, the movable inner comb electrode 62, and the movable outer comb electrode 72 are the third structures.

Note that FIG. 2 illustrates the base 1 and the second hinge 5 as examples of the first structure, illustrates the fixed inner comb electrode 61 as an example of the second structure, and illustrates the mirror 2 and the movable inner comb electrode 62 as examples of the third structure. Although each structure illustrated in FIG. 2 will be described below, the structure not illustrated as an example is also formed as in the structure of the same category.

Figure 3:
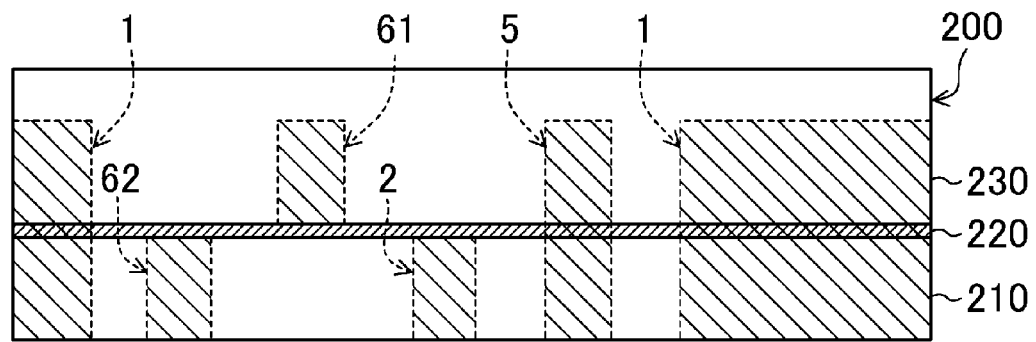
FIG. 3 is a cross-sectional view of an SOI substrate.

First, as illustrated in FIG. 3, an SOI substrate 200 is prepared. FIG. 3 is a cross-sectional view of the SOI substrate 200. In FIG. 3, each structure, which will be formed in the SOI substrate 200, of the mirror device 100 is indicated by dashed lines, and is hatched. As described above, the SOI substrate 200 is configured such that a first silicon layer 210 made of silicon, an oxide layer 220 made of $SiO_2$, and a second silicon layer 230 made of silicon are stacked on each other in this order. The SOI substrate 200 is an example of a substrate. The first silicon layer 210 is an example of a first layer, the second silicon layer 230 is an example of a second layer, and the oxide layer 220 is an example of a third layer.

Next, the SOI substrate 200 is etched from the side close to the first silicon layer 210 (a first etching step). At this step, a portion of the first silicon layer 210 facing at least a fixed inner comb electrode 61 is removed by etching. In addition, a portion of the first silicon layer 210 is etched, except for a portion of the first silicon layer 210 forming a base 1, a mirror 2, second hinges 5, and a movable inner comb electrode 62.

Figure 4:
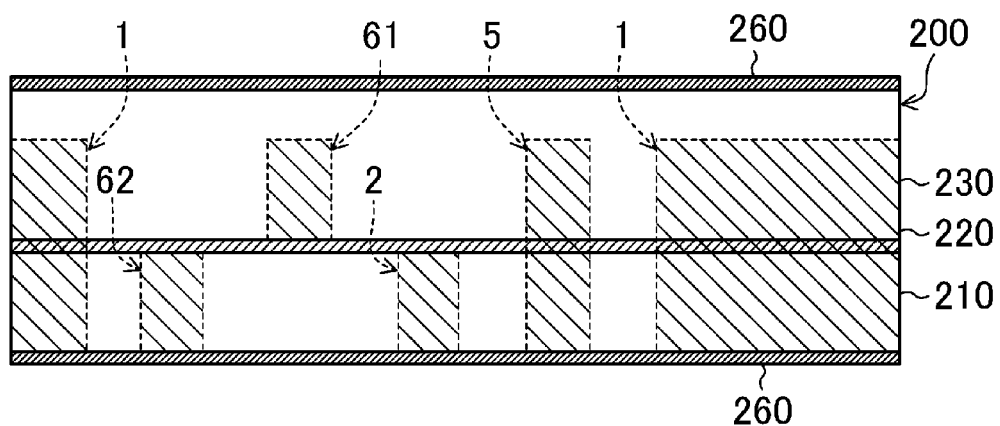
FIG. 4 is a view of the step of forming an $SiO_2$ film on the SOI substrate.

Specifically, $SiO_2$ films 260 are first formed respectively on both sides of the SOI substrate 200 by thermal oxidation, as illustrated in FIG. 4.

Next, a mirrored surface layer 23 is formed on the back surface of a mirror body 21.

Figure 5A:
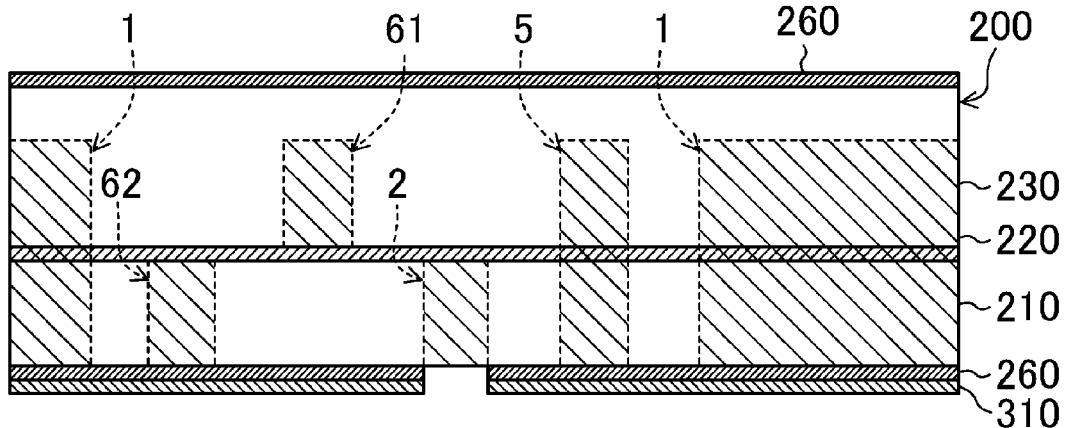
FIGS. 5A to 5C are views of the steps of forming a mirrored surface layer at a mirror pre-structure.

First, as illustrated in FIG. 5A, a first resist mask 310 is formed on the $SiO_2$ film 260 formed on the first silicon layer 210 of the SOI substrate 200, and then, a portion of the $SiO_2$ film 260 is etched. The $SiO_2$ film 260 on a portion of the first silicon layer 210 forming the mirror 2 is exposed through the first resist mask 310. The $SiO_2$ film 260 is etched using the first resist mask 310, and then, the $SiO_2$ film 260 at the portion of the first silicon layer 210 forming the mirror 2 is removed.

Figure 5B:
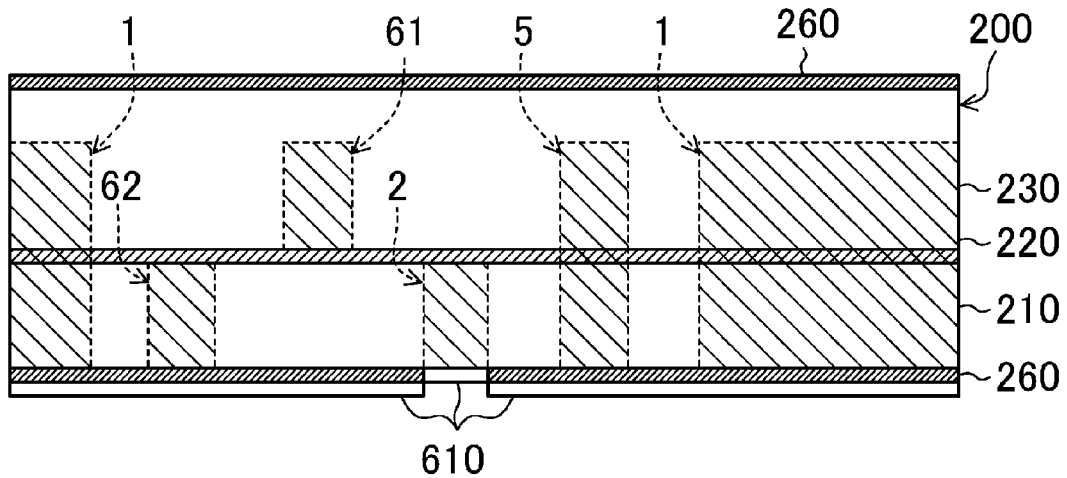

Subsequently, the first resist mask 310 is detached. As illustrated in FIG. 5B, an Au/Ti/Pt film 610 is, by sputtering, formed on the portion of the first silicon layer 210 forming the mirror 2. At this point, the Au/Ti/Pt film 610 is also formed on the $SiO_2$ film 260.

Figure 5C:
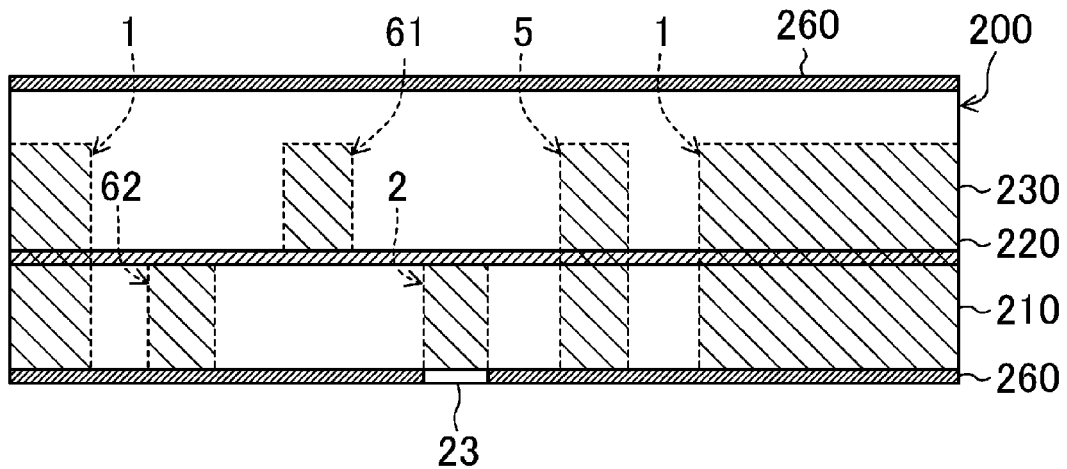

Then, a resist mask (not shown) is formed on the Au/Ti/Pt film 610 at the portion of the first silicon layer 210 forming the mirror 2, and then, the Au/Ti/Pt film 610 on the $SiO_2$ film 260 is removed by etching. In this manner, the mirrored surface layer 23 is formed of the Au/Ti/Pt film 610, as illustrated in FIG. 5C. Note that the $SiO_2$ film 260 remains on a portion of the first silicon layer 210 other than the portion forming the mirror 2. Subsequently, although not shown in the figure, the $SiO_2$ film 260 on a portion of the first silicon layer 210 is removed by etching, the portion of the first silicon layer 210 being joined to a later-described glass substrate 600.

Figure 6A:
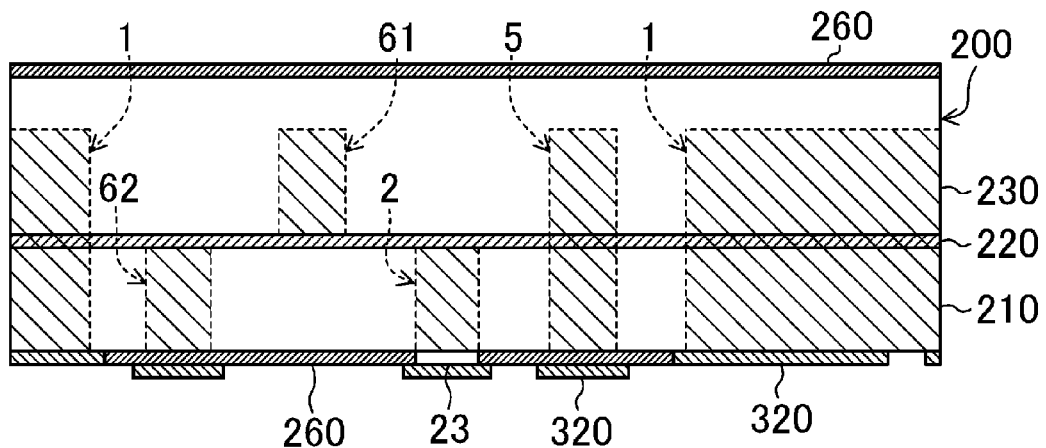
FIGS. 6A to 6C are views of a first etching step.

Next, a second resist mask 320 is formed on the first silicon layer 210. The second resist mask 320 is in the shape covering a portion of the first silicon layer 210 forming the first and third structures. In an example of FIG. 6A, a portion of the first silicon layer 210 forming the base 1, a portion of the first silicon layer 210 forming the mirror 2, a portion of the first silicon layer 210 forming the second hinges 5, and a portion of the first silicon layer 210 forming the movable inner comb electrode 62 are covered by the second resist mask 320. The second resist mask 320 has a larger shape than the final shape of a corresponding one of the structures. Unless otherwise provided, the "final shape" and the "shape" mean the shape when the structure is viewed in the thickness direction of the mirror device 100, i.e., the shape when the structure is projected in the thickness direction of the mirror device 100.

Subsequently, the oxide layer 260 is etched using the second resist mask 320, and then, a portion of the oxide film 260 exposed through the second resist mask 320 is removed. Etching of the oxide layer 260 is etching (hereinafter referred to as "APS etching") using an advanced physical source (APS) of high-density plasma.

Figure 6B:
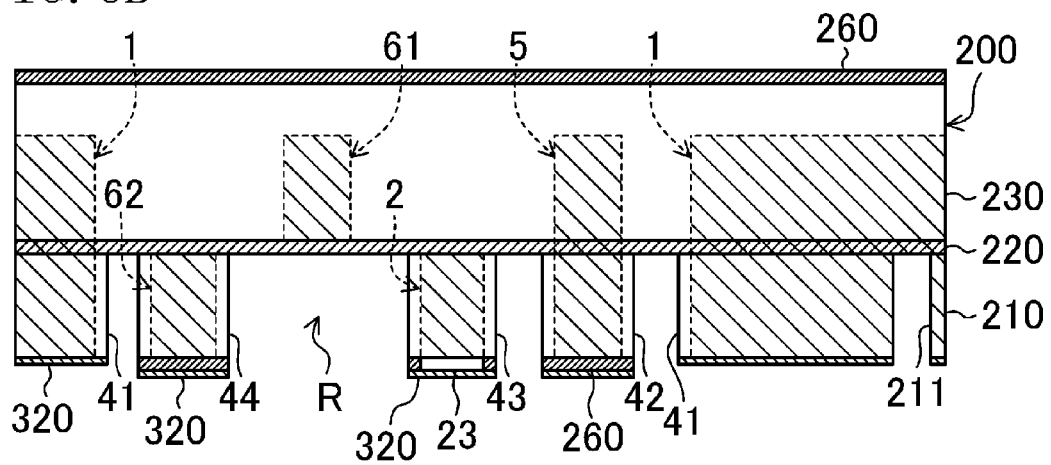

Next, as illustrated in FIG. 6B, the first silicon layer 210 is etched using the second resist mask 320. Etching of the silicon layer is etching (hereinafter referred to as "ICP etching") using inductively coupled plasma (ICP). In the first silicon layer 210, a pre-structure 41 formed of the first silicon layer 210 of the base 1, a pre-structure 42 formed of the first silicon layer 210 of each second hinge 5, a pre-structure 43 of the mirror 2, and a pre-structure 44 of the movable inner comb electrode 62 are formed. The "pre-structure" is the structure having a larger shape than a corresponding final shape and formed into the corresponding final shape by etching. Moreover, a portion of the first silicon layer 210 facing the fixed inner comb electrode 61 is etched such that a recess R is formed. Further, a first alignment mark 211 is formed in the first silicon layer 210.

The pre-structure 41 is hereinafter referred to as a "base pre-structure 41," the pre-structure 42 is hereinafter referred to as a "second-hinge pre-structure 42," the pre-structure 43 is hereinafter referred to as a "mirror pre-structure 43," and the pre-structure 44 is hereinafter referred to as a "movable-comb pre-structure 44." When the above-described pre-structures are not distinguished from each other, each pre-structure may be simply referred to as a "pre-structure." The base pre-structure 41 and the second-hinge pre-structure 42 are examples of a first pre-structure. The mirror pre-structure 43 and the movable-comb pre-structure 44 are examples of a third pre-structure.

Figure 6C:
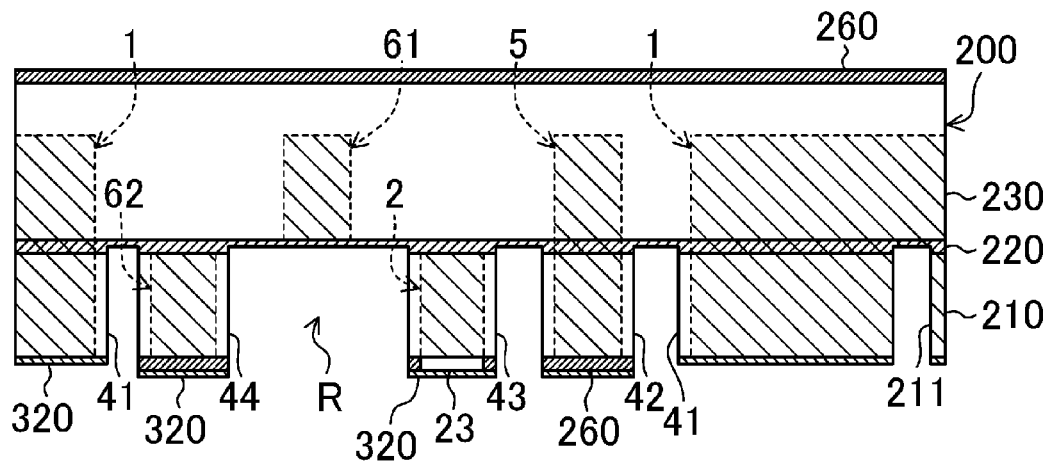

Subsequently, as illustrated in FIG. 6C, the oxide layer 220 is APS-etched using the second resist mask 320 such that a portion of the oxide layer 220 exposed through the second resist mask 320 becomes thinner. At this point, the oxide layer 220 is not completely etched, but the oxide layer 220 remains thin. After etching of the oxide layer 220, the second resist mask 320 is detached. Note that the step of decreasing the thickness of the oxide layer 220 may be skipped.

Figure 7:
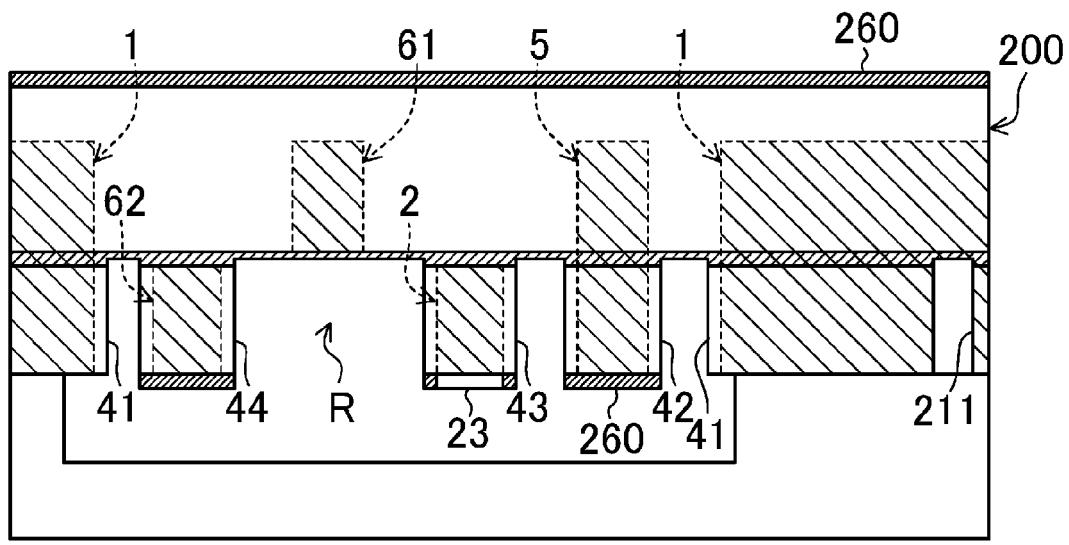
FIG. 7 is a view of the step of joining a glass substrate onto the SOI substrate.

Next, as illustrated in FIG. 7, an anode of the glass substrate 600 is welded to the first silicon layer 210. The glass substrate 600 is joined to a portion of the first silicon layer 210 not including the $SiO_2$ film 260.

Figure 8:
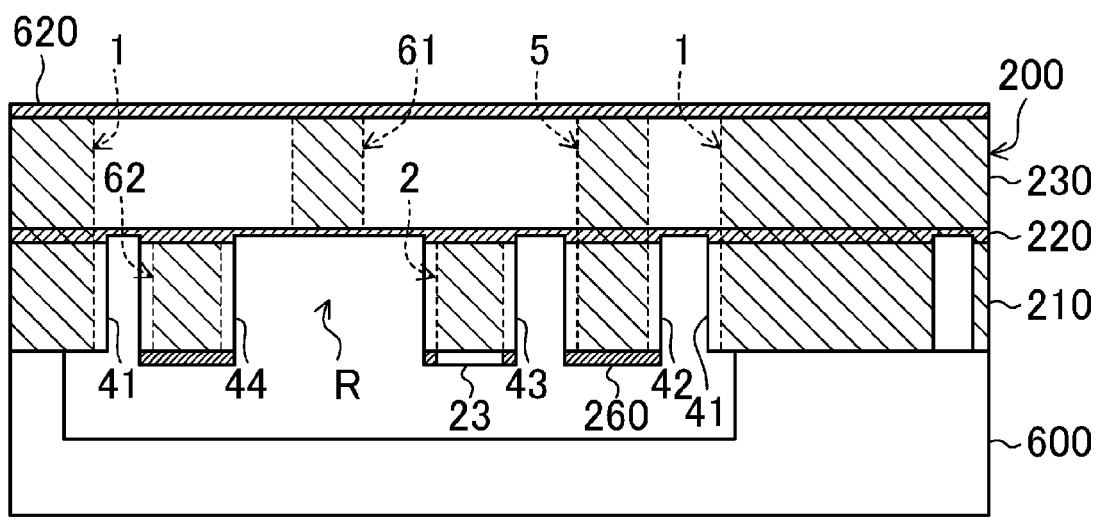
FIG. 8 is a view of the step of forming an $SiO_2$ film on a second silicon layer.

Next, a final mask 390 for etching the SOI substrate 200 from the side close to the second silicon layer 230 is formed (a mask formation step). The final mask 390 is an example of a mask. First, a $SiO_2$ film 620 is formed on the second silicon layer 230, as illustrated in FIG. 8. Specifically, the second silicon layer 230 is first processed thin to a desired thickness by back grinding. Subsequently, the $SiO_2$ film 620 is formed on the second silicon layer 230 by vapor deposition (e.g., low pressure CVD).

Figure 9:
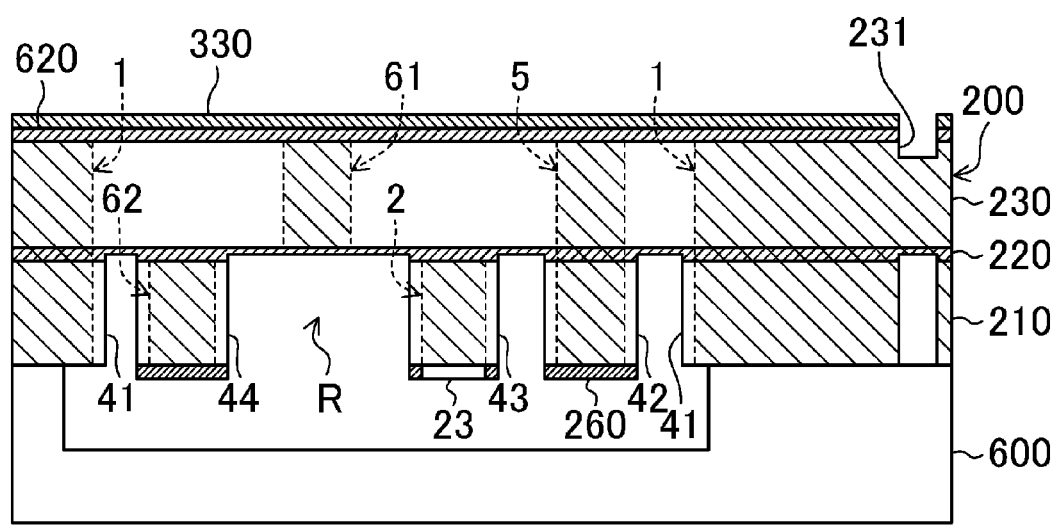
FIG. 9 is a view of the step of forming a second alignment mark on the second silicon layer.

Subsequently, a second alignment mark 231 is formed in the $SiO_2$ film 620 and the second silicon layer 230, as illustrated in FIG. 9. Specifically, a third resist mask 330 is formed on the $SiO_2$ film 620. The $SiO_2$ film 620 and the second silicon layer 230 are sequentially etched using the third resist mask 330, and as a result, the second alignment mark 231 is formed in the $SiO_2$ film 620 and the second silicon layer 230. Subsequently, the third resist mask 330 is detached.

Next, an oxide mask 370 is formed by etching of the $SiO_2$ film 620, and then, a fifth resist mask 350 is formed.

Figure 10A:
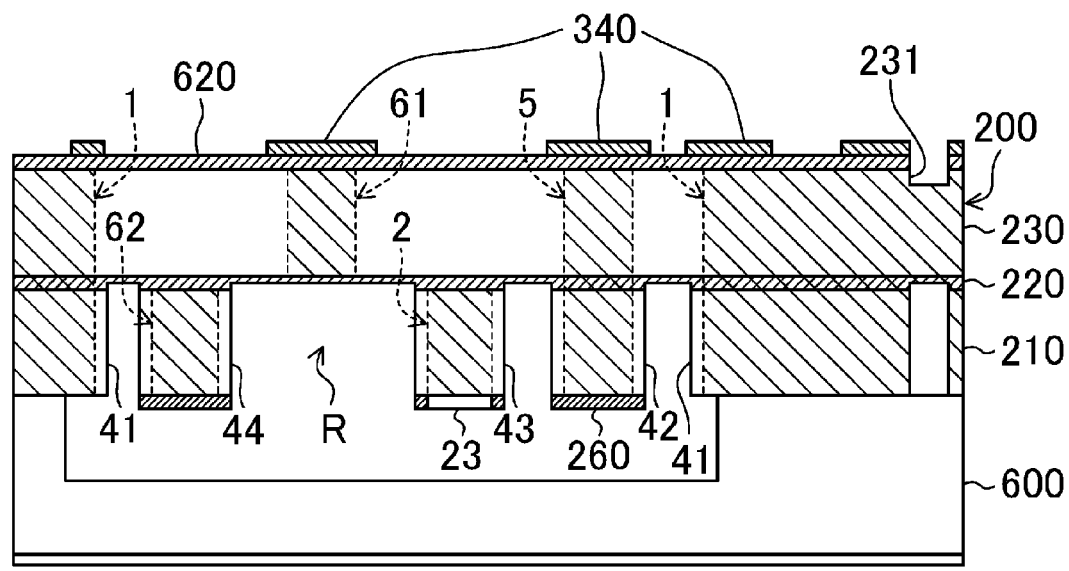
FIGS. 10A and 10B are views of the steps of forming an oxide mask.

As illustrated in FIG. 10A, a fourth resist mask 340 is first formed on the $SiO_2$ film 620. Although will be described in detail with reference to the fifth resist mask 350, the fourth resist mask 340 is formed as follows. After a resist is applied onto the $SiO_2$ film 620, a predetermined photomask (e.g., a stencil mask) is placed using the second alignment mark 231. Then, the resist is exposed with light, and is developed. In this manner, the fourth resist mask 340 is formed. The photomask is a shield member formed with an opening, and is a member which can be physically separated from the SOI substrate 200. The positional relationship of the resist mask is defined by the photomask.

Figure 10B:
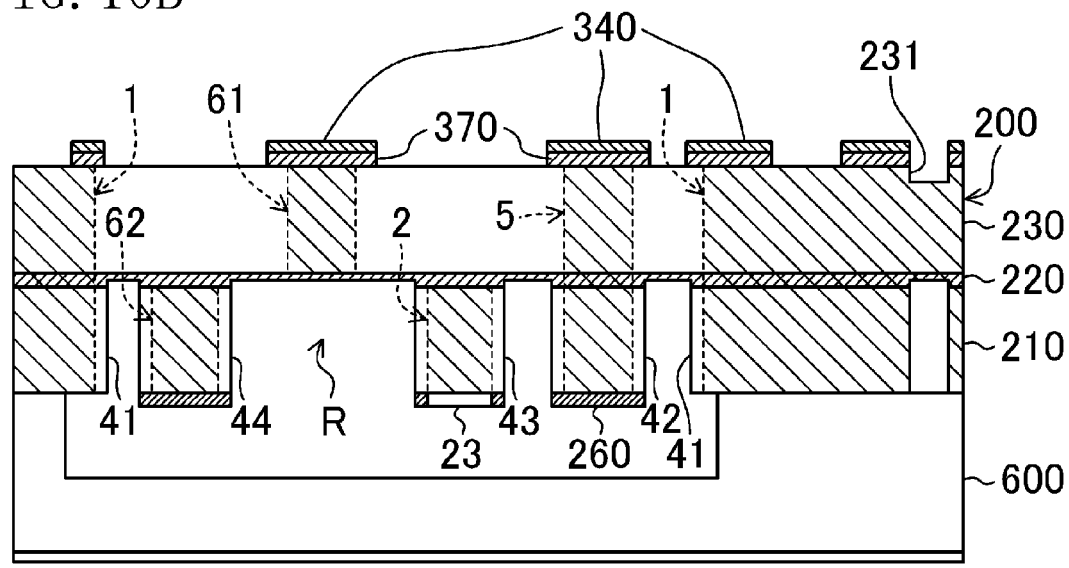

Subsequently, the $SiO_2$ film 620 is APS-etched using the fourth resist mask 340. In this manner, the oxide mask 370 is formed as illustrated in FIG. 10B. Then, the fourth resist mask 340 is detached.

The oxide mask 370 is in such a shape that a portion of the second silicon layer 230 forming the first and second structures is covered. In the example of FIG. 10B, a portion of the second silicon layer 230 forming the base 1, a portion of the second silicon layer 230 forming each second hinge 5, and a portion of the second silicon layer 230 forming the fixed inner comb electrode 61 are covered by the oxide mask 370. The oxide mask 370 has a larger shape than the final shape of a corresponding one of the structures.

Note that no oxide mask 370 is provided corresponding to an insulation groove 240 of the base 1 and to each opening 245*a* where a common electrode 255 is provided.

Figure 11A:
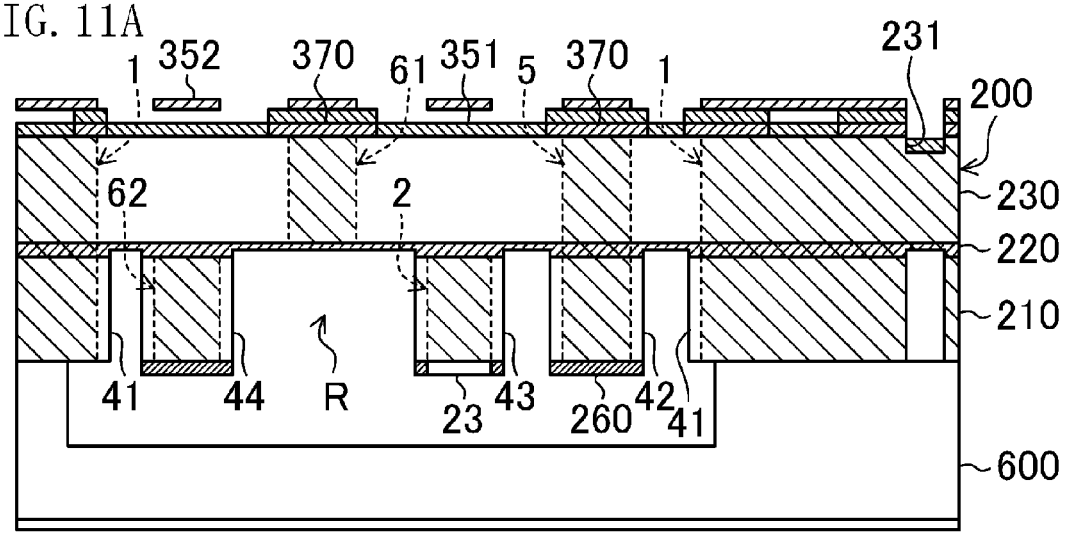
FIGS. 11A to 11C are views of the steps of forming a fifth resist mask.
Figure 11B:
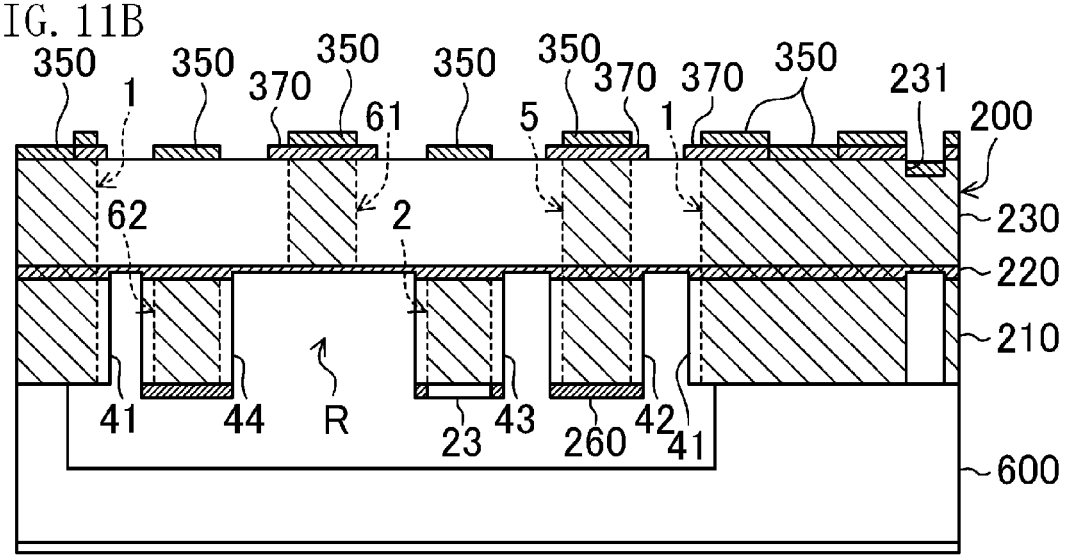

Subsequently, the fifth resist mask 350 is formed on the second silicon layer 230 and the oxide mask 370. First, a resist 351 is applied onto the second silicon layer 230 and the oxide mask 370. Subsequently, a photomask 352 is placed on the resist 351, as illustrated in FIG. 11A. Using the photomask 352, the resist 351 is exposed with light, and then, is developed. In this manner, the fifth resist mask 350 is formed as illustrated in FIG. 11B.

The fifth resist mask 350 is provided corresponding to the first to third structures. That is, the portion forming the first structure and the portion forming the second structure are doubly covered by the oxide mask 370 and the fifth resist mask 350. In the example of FIG. 11B, the oxide mask 370 and the fifth resist mask 350 are provided corresponding to the base 1, each second hinge 5, and the fixed inner comb electrode 61 on the second silicon layer 230. Only the fifth resist mask 350 is provided corresponding to the mirror 2 and the movable inner comb electrode 62 on the second silicon layer 230. In this state, the fifth resist mask 350 has the same shape as the final shape of a corresponding one of the structures. Thus, the oxide mask 370 protrudes beyond the fifth resist mask 350 at the position where the fifth resist mask 350 and the oxide mask 370 overlap with each other.

Figure 11C:
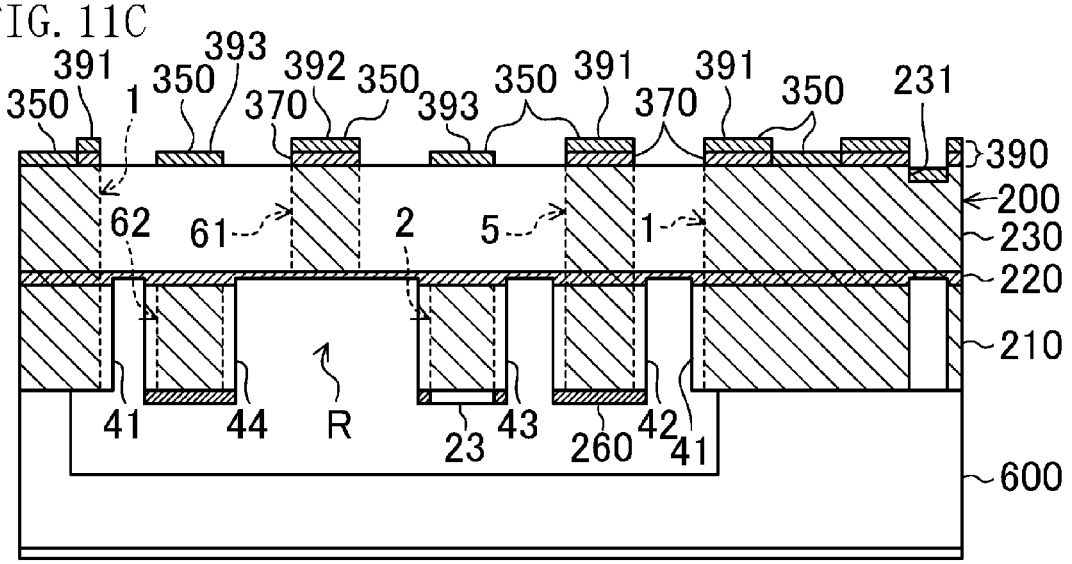

Subsequently, as illustrated in FIG. 11C, a portion of the oxide mask 370 protruding beyond the fifth resist mask 350 is removed by the APS etching. Thus, the oxide mask 370 is formed to have the same shape as that of the fifth resist mask 350 at the position where the oxide mask 370 and the fifth resist mask 350 overlap with each other.

In this manner, the final mask 390 including the oxide mask 370 and the fifth resist mask 350 is formed. The final mask 390 includes a first mask 391 corresponding to the final shape of the first structure, a second mask 392 corresponding to the final shape of the second structure, and a third mask 393 corresponding to the final shape of the third structure. The first mask 391 is formed corresponding to the base 1 and each second hinge 5 on the second silicon layer 230. The second mask 392 is formed corresponding to the fixed inner comb electrode 61 on the second silicon layer 230. The third mask 393 is formed corresponding to the mirror 2 and the movable inner comb electrode 62 on the second silicon layer 230. Moreover, the first mask 391 and the second mask 392 each include the oxide mask 370 formed on the second silicon layer 230, and the fifth resist mask 350 formed on the oxide mask 370. The oxide mask 370 is an example of a lower mask, and the fifth resist mask 350 is an example of an upper mask. On the other hand, the third mask 393 does not include the oxide mask 370, but includes only the fifth resist mask 350. Note that no oxide mask 370 is provided corresponding to the insulation groove 240 of the base 1 and each opening 245*a* where the common electrode 255 is provided, but only the fifth resist mask 350 is provided corresponding to these portions.

Figure 12A:
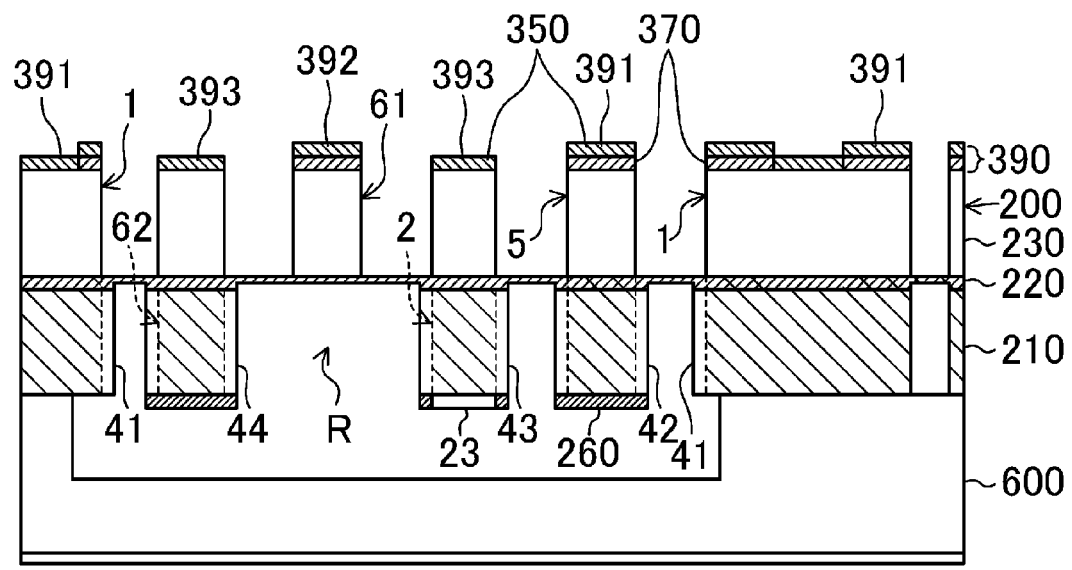
FIGS. 12A and 12B are views of the steps of etching using a final mask.

Next, the second silicon layer 230 and the oxide layer 220 are etched using the final mask 390 (a second etching step). Specifically, the second silicon layer 230 is first ICP-etched as illustrated in FIG. 12A. As a result, a portion of the base 1 formed of the second silicon layer 230 and a portion of each second hinge 5 formed of the second silicon layer 230 are formed. Moreover, the fixed inner comb electrode 61 is formed. Further, a portion of the second silicon layer 230 facing the mirror 2 and the movable inner comb electrode 62 remains.

In this state, the final mask 390 is in the shape corresponding to the final shape of each structure. Thus, the portion of the base 1 formed of the second silicon layer 230, the portion of each second hinge 5 formed of the second silicon layer 230, and the fixed inner comb electrode 61 are formed into the final shapes at this step.

Figure 12B:
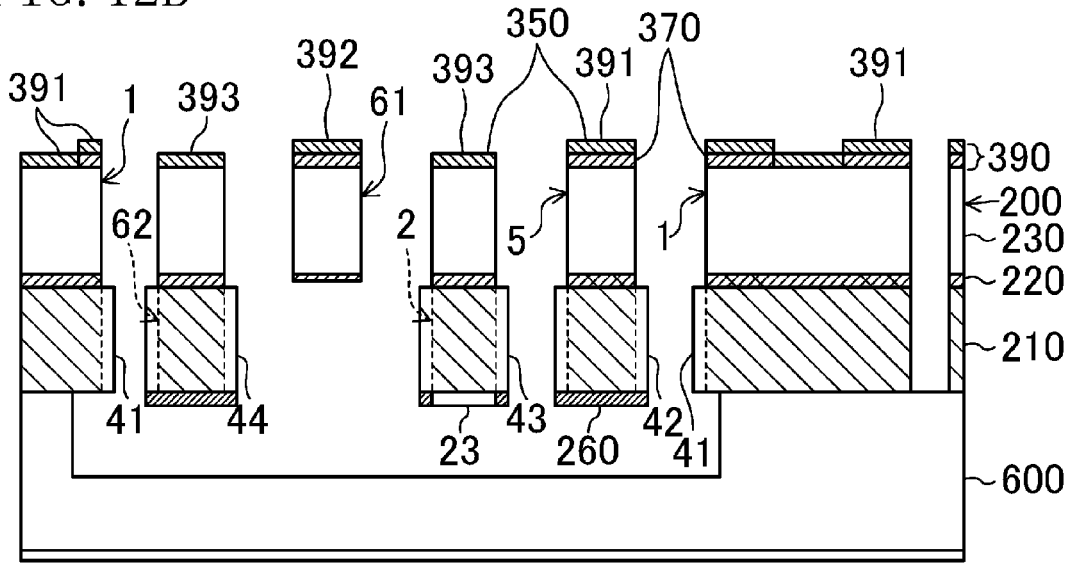

Subsequently, the oxide layer 220 is APS-etched as illustrated in FIG. 12B. As a result, a portion of the oxide layer 220 exposed through the final mask 390 is removed. Of the pre-structures 41 to 44 formed of the first silicon layer 210, the portion protruding beyond the final mask 390 is exposed. Then, the fifth resist mask 350 of the final mask 390 is detached.

Figure 13A:
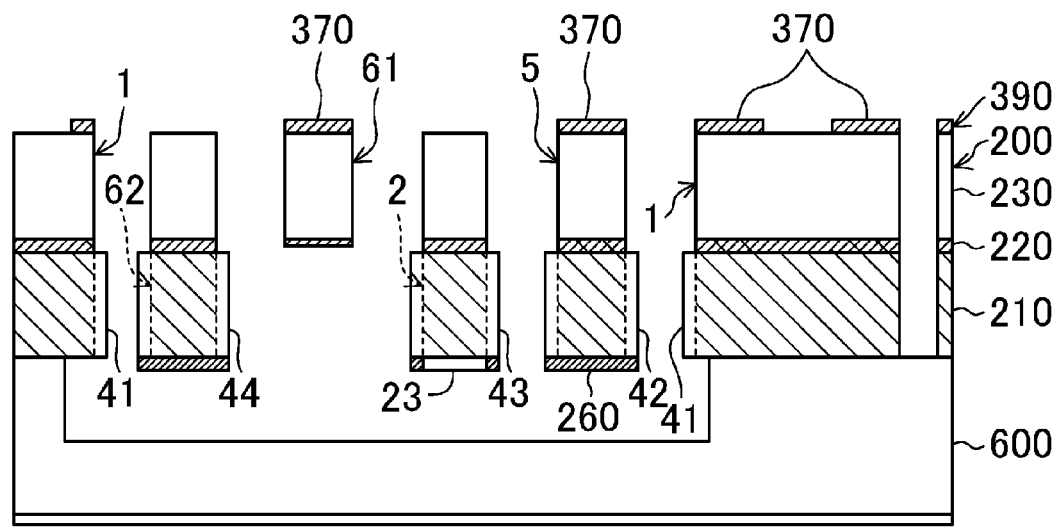
FIGS. 13A and 13B are views of the steps of forming each pre-structure into a corresponding final shape.
Figure 13B:
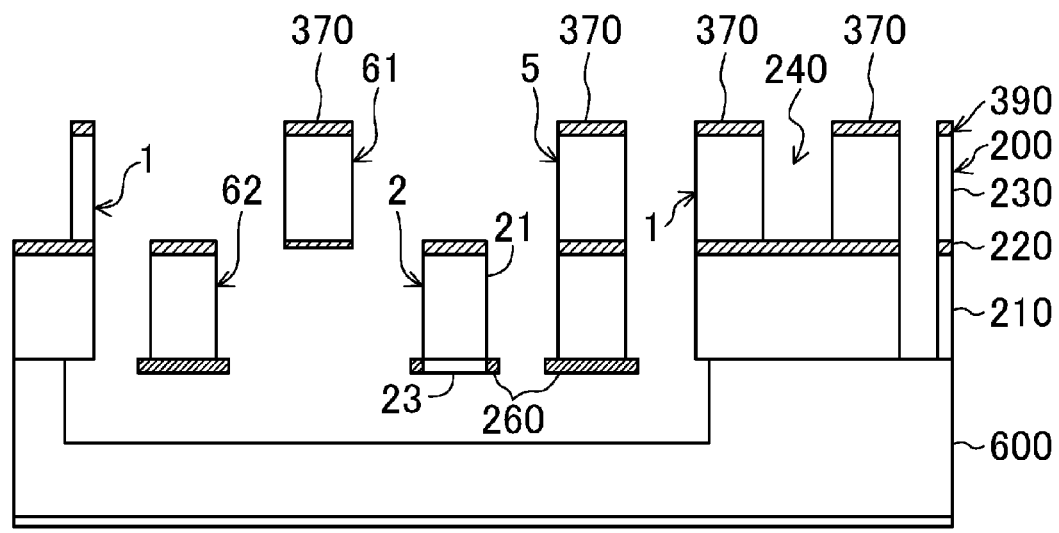

Next, the first silicon layer 210 and the second silicon layer 230 are etched using the oxide mask 370. Specifically, the fifth resist mask 350 is detached such that a portion of the remaining second silicon layer 230 which is not covered by the oxide mask 370, i.e., a portion of the remaining second silicon layer 230 facing the mirror pre-structure 43 and the movable-comb pre-structure 44, is exposed as illustrated in FIG. 13A. In this state, a portion of the second silicon layer 230 corresponding to the insulation groove 240 of the base 1 and to each opening 245a where the common electrode 255 is provided is also exposed. As described above, a portion of the pre-structures 41 to 44 protruding beyond the oxide layer 220 is also exposed. In this state, a portion of the second silicon layer 230 facing the mirror pre-structure 43 and the movable-comb pre-structure 44, a portion of the second silicon layer 230 corresponding to the insulation groove 240 of the base 1 and to each opening 245a, and a portion of the pre-structures 41 to 44 protruding beyond the oxide layer 220 are ICP-etched as illustrated in FIG. 13B. In this state, the oxide layer 220 functions as a mask for etching the pre-structures 41 to 44.

The oxide layer 220 is etched using the final mask 390 at the step of FIG. 12B, and as a result, is formed into the shape similar to that of the final mask 390. That is, since the oxide layer 220 has the shape corresponding to the final shape of each structure, each of the pre-structures 41 to 44 etched at this step is formed into a corresponding one of the final shapes of the structures. Specifically, the base pre-structure 41 is formed into the final shape of a portion of the base 1 formed of the first silicon layer 210. The second-hinge pre-structure 42 is formed into the final shape of a portion of each second hinge 5 formed of the first silicon layer 210. The mirror pre-structure 43 is formed into the final shape of the mirror 2 (the mirror body 21). The movable-comb pre-structure 44 is formed into the final shape of the movable inner comb electrode 62.

Of each of the second hinges 5, the mirror 2, and the movable inner comb electrode 62, the $SiO_2$ film 260 remains in the shape corresponding to the pre-structure, and is not formed into the final shape.

Figure 14:
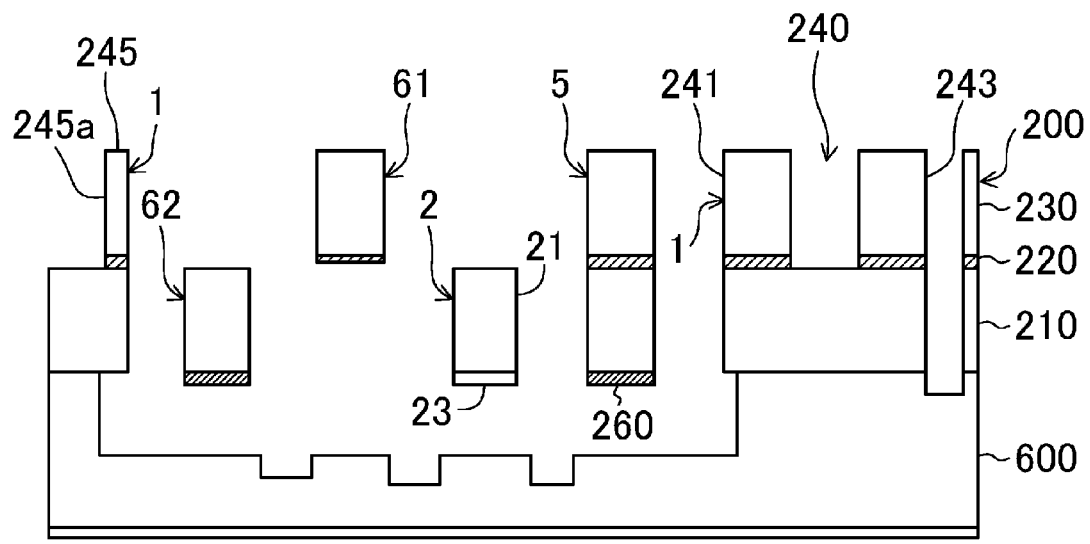
FIG. 14 is a view of the step of removing an unnecessary portion of the oxide layer and the oxide mask.

Next, the oxide mask 370, the oxide layer 220 positioned at the bottoms of the insulation groove 240 and each opening 245a, and the oxide layer 220 provided on the mirror 2 and the movable inner comb electrode 62 are removed by the APS etching as illustrated in FIG. 14.

In this state, the $SiO_2$ film 260 forming the second hinges 5, the mirror 2, and the movable inner comb electrode 62 is also removed and formed into each final shape.

Note that the insulation groove 240 is formed, and therefore, first to fifth regions 241 to 245 are formed at the base 1 (only the first region 241, the third region 243, and the fifth region 245 are illustrated in FIG. 14).

Figure 15:
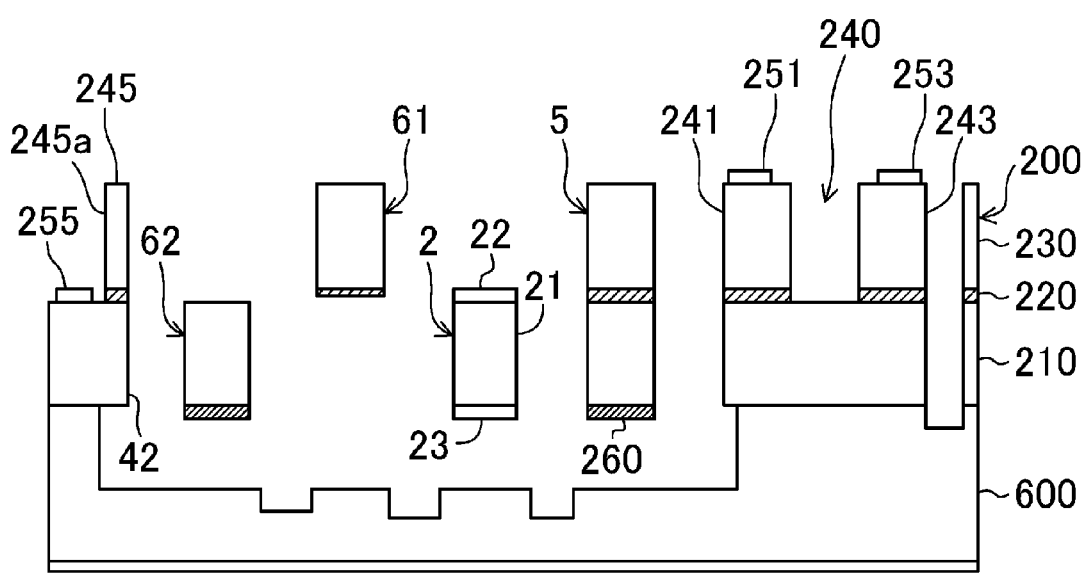
FIG. 15 is a view of the step of wire bonding, and illustrates the step of forming electrodes and a mirrored surface layer.

Subsequently, electrodes and a mirrored surface layer are formed, and wires are connected to the electrodes by wire bonding. Specifically, as illustrated in FIG. 15, an Au/Ti/Pt film is, using a photomask (not shown), formed at a predetermined portion by sputtering, and as a result, electrodes and a mirrored surface layer 22 are formed. In the example of FIG. 15, a first drive electrode 251, a third drive electrode 253, and the common electrode 255 are formed. Moreover, an Au/Ti/Pt film is formed on the surface of the mirror body 21 close to the second silicon layer 230, and as a result, the mirrored surface layer 22 is formed. Subsequently, wire bonding is performed for the first drive electrode 251, the third drive electrode 253, and the common electrode 255 (see FIG. 2).

In this manner, the mirror device 100 is manufactured.

In the manufacturing method including processing of the SOI substrate 200 from each side thereof as described above, alignment between the position in processing of the SOI substrate 200 from one side thereof and the position in processing of the SOI substrate 200 from the other side thereof is important. For example, in the above-described manufacturing method, the first and second alignment marks 211, 231 formed respectively on both sides of the SOI substrate 200 are used so that the position in processing of the SOI substrate 200 from one side thereof and the position in processing of the SOI substrate 200 from the other side thereof can be aligned to each other. However, in some cases, there might be an error between the position in processing of the SOI substrate 200 from one side thereof and the position in processing of the SOI substrate 200 from the other side thereof. For example, after the SOI substrate 200 is processed from the side close to the first silicon layer 210, the position of the final mask 390 might be displaced when the SOI substrate 200 is processed from the side close to the second silicon layer 230. In this case, the position of the structure processed from the side close to the first silicon layer 210 and the position of the structure processed from the side close to the second silicon layer 230 are misaligned from each other in a typical manufacturing method. However, according to the above-described manufacturing method, the structures can be precisely formed even when the position of the final mask 390 is displaced.

Figure 16A:
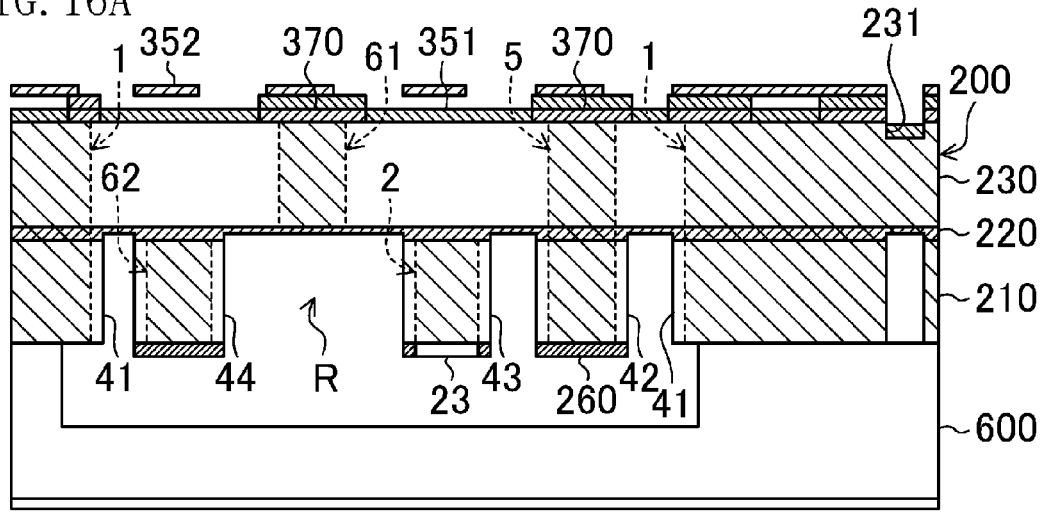
FIGS. 16A to 16C are views for describing displacement of the position of the final mask.
Figure 16B:
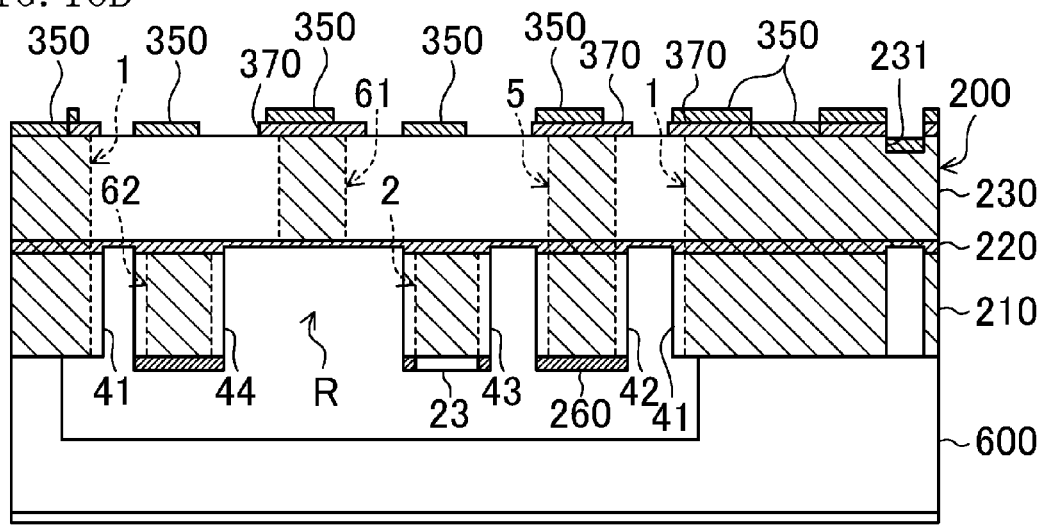
Figure 16C:
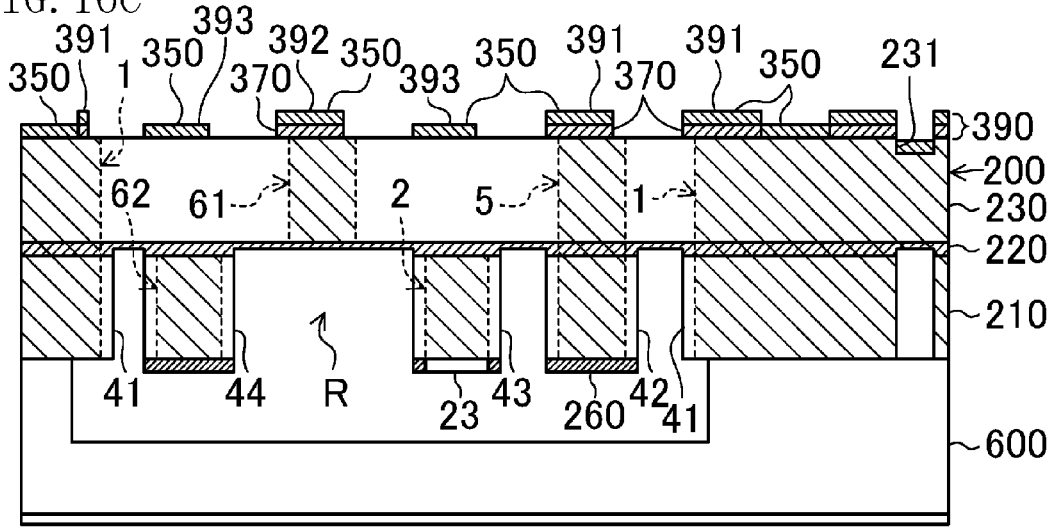

Specifically, when the position of the photomask 352 is displaced as illustrated in FIG. 16A, the position of the fifth resist mask 350 is also displaced as illustrated in FIG. 16B. With displacement of the position of the fifth resist mask 350, the position of the finally-formed final mask 390 is also displaced as illustrated in FIG. 16C. As a result, the portion formed using the final mask 390 is also displaced from a proper position.

Of the base 1 and the second hinges 5 as the first structures, the portion formed of the first silicon layer 210 is first formed. Thus, there is a disadvantage that the position of the portion formed of the first silicon layer 210 is misaligned from the position of the portion formed of the second silicon layer 230.

However, the portion of the first structure formed of the first silicon layer 210 is formed as the pre-structure larger than the final shape when the SOI substrate 200 is processed from the side close to the first silicon layer 210. The first mask 391 of the final mask 390 is, as illustrated in FIG. 16C, formed in the pre-structure as viewed in the thickness direction of the mirror device 100. That is, the size of the pre-structure is set considering the maximum possible positional displacement of the final mask 390. In other words, even with the maximum possible positional displacement of the final mask 390, the first mask 391 is placed in the pre-structure as viewed in the thickness direction of the mirror device 100.

Note that the oxide mask 370 formed before formation of the photomask 352 is, considering the maximum possible positional displacement of the photomask 352, formed larger than the final shape of the oxide mask 370, i.e., the final shape of the final mask 390. Even with displacement of the position of the photomask 352, this prevents the fifth resist mask 350 formed on the oxide mask 370 from protruding beyond the oxide mask 370.

Figure 17A:
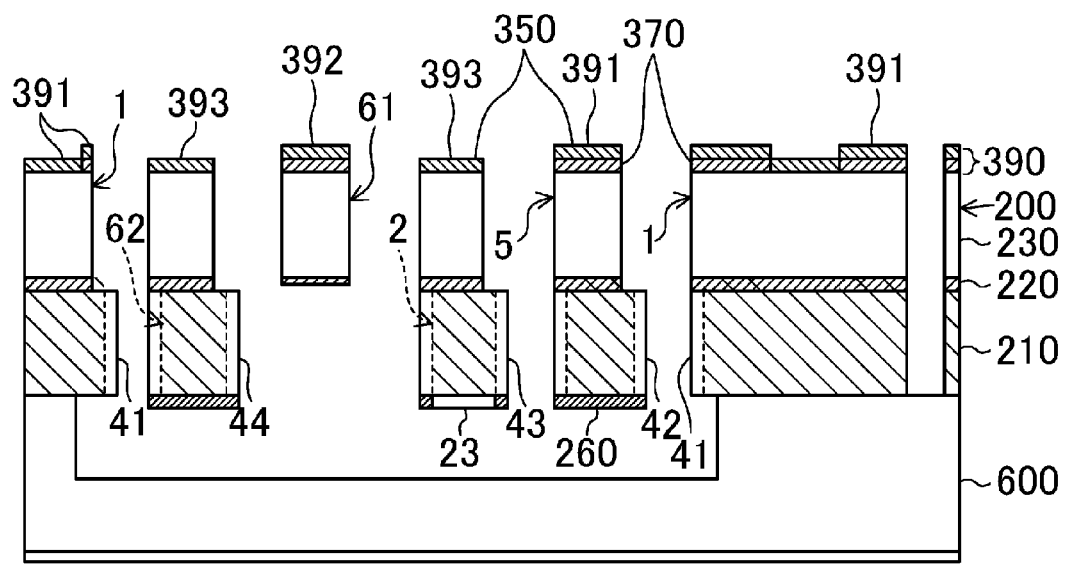
FIGS. 17A and 17B are views of etching using the displaced final mask.
Figure 17B:
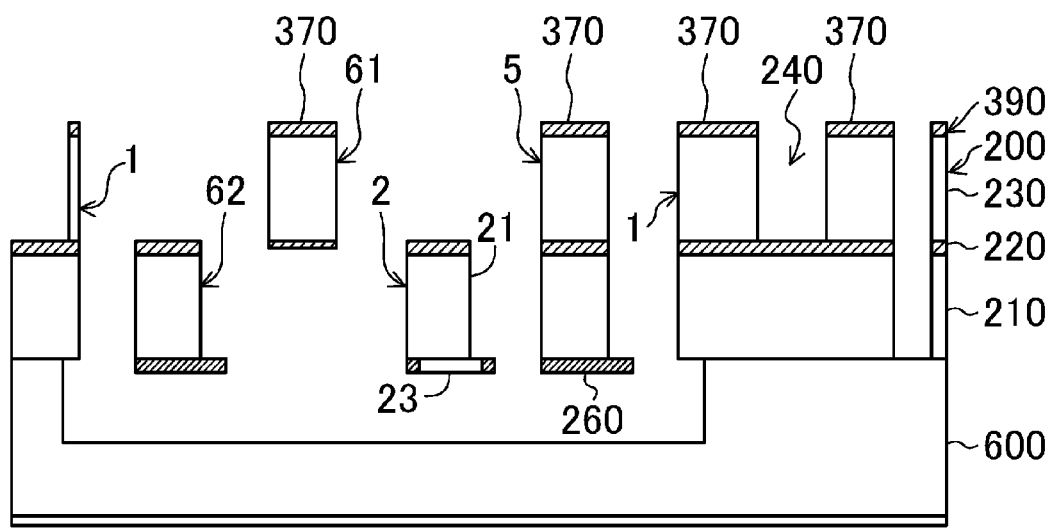

The second silicon layer 230 and the oxide layer 220 are sequentially etched using the first mask 391. As a result, as illustrated in FIG. 17A, a portion of the first structure formed of the second silicon layer 230 is formed into the final shape, and the oxide layer 220 is formed into the final shape. Subsequently, the pre-structure is etched using the oxide layer 220 and the oxide mask 370 of the first mask 391, and as a result, the portion of the first structure formed of the first silicon layer 210 is formed into the final shape.

The portion of the first structure formed of the first silicon layer 210 and the portion of the first structure formed of the second silicon layer 230 are both formed into the final shapes by the displaced final mask 390. As a result, the position of the first structure in the entirety of the mirror device 100 is displaced by displacement of the position of the final mask 390. However, misalignment between the position of the portion of the first structure formed of the first silicon layer 210 and the position of the portion of the first structure formed of the second silicon layer 230 is prevented, and therefore, the first structure can be precisely formed.

For example, if the shape of each second hinge 5 as the first structure is not precise, the spring constant of each second hinge 5 changes, and as a result, the driving performance of the mirror 2 is lowered. That is, with precise formation of each second hinge 5, the accuracy of the spring constant of each second hinge 5 supporting the mirror 2 can be enhanced, and therefore, the driving performance of the mirror 2 can be ensured.

A major factor for displacement of the position of the final mask 390 is displacement of the position of the photomask 352. Displacement of the position of the photomask 352 displaces not only the position of the first mask 391 of the final mask 390 but also the position of the second mask 392 of the final mask 390.

The second structure does not include the first silicon layer 210. Thus, when the second silicon layer 230 is etched using the second mask 392, a portion of the first silicon layer 210 facing the second structure is removed in advance such that the recess R is formed. However, if the second mask 392 is displaced to the position from which the first silicon layer 210 is not removed, the second structure still including the first silicon layer 210 is formed as a result of etching the second silicon layer 230 using the second mask 392.

On the other hand, in the above-described manufacturing method, the second mask 392 is, as illustrated in FIG. 16C, formed in the recess R pre-formed at the first silicon layer 210 as viewed in the thickness direction of the mirror device 100. That is, the recess R is set considering the maximum possible positional displacement of the final mask 390. Thus, even with the maximum possible positional displacement of the final mask 390, the second mask 392 is placed in the recess R as viewed in the thickness direction of the mirror device 100.

Thus, the second structure not including the first silicon layer 210 can be formed in such a manner that the second silicon layer 230 is etched using the second mask 392. That is, the second structure can be precisely formed.

For example, the imprecise shapes of the fixed inner comb electrode 61 and the fixed outer comb electrode 71 as the second structures leads to variation in the positional relationship between the fixed inner comb electrode 61 and the movable inner comb electrode 62 and variation in the positional relationship between the fixed outer comb electrode 71 and the movable outer comb electrode 72. As a result, the driving performance of the mirror 2 is lowered. On the other hand, the fixed inner comb electrode 61 and the fixed outer comb electrode 71 are precisely formed so that the driving performance of the mirror 2 can be ensured.

Further, according to the above-described manufacturing method, the third structure not including the second silicon layer 230 and formed of the first silicon layer 210 is formed into the final shape when the SOI substrate 200 is processed from the side close to the second silicon layer 230. In this manner, even if the positions of the first and second structures in the entirety of the mirror device 100 are displaced due to displacement of the position of the final mask 390, the positional relationship between the third and first structures and the positional relationship between the third and second structures can be maintained. That is, the third structures is, using the final mask 390, formed into the final shape when the SOI substrate 200 is processed from the side close to the second silicon layer 230. With displacement of the position of the final mask 390, the positions of the first to third masks 391 to 393 are also displaced together. For this reason, if the first and second structures are formed at the displaced positions thereof, the third structure is similarly formed at the displaced position thereof. As a result, the positional relationship between the third and first structures and the positional relationship between the third and second structures are maintained. As in the first structure, the first silicon layer 210 is, at the first etching step, formed into the pre-structure formed larger than the final shape of the third structure. Moreover, the third mask 393 is, at the mask formation step, formed in the pre-structure as viewed in the thickness direction of the mirror device 100. In this manner, the third structure can be precisely formed.

For example, the positional relationship between the third and first structures is maintained, and therefore, the frame body 3 forming both of the first and third structures can be formed into a precise shape. Moreover, since the positional relationship between each second hinge 5 as the first structure and the mirror 2 as the third structure is maintained, misalignment of the mirror 2 from a tilting axis can be reduced or prevented. In addition, since the positional relationship between the fixed inner comb electrode 61 as the second structure and the movable inner comb electrode 62 as the third structure is maintained, lowering of the driving performance of the mirror 2 can be reduced or prevented. Similarly, since the positional relationship between the fixed inner comb electrode 61 as the second structure and the movable inner comb electrode 62 as the third structure is maintained, lowering of the driving performance of the mirror 2 can be reduced or prevented.

Note that the method for manufacturing the mirror device 100 is not limited to the above-described method.

For example, in the above-described manufacturing method, the following process is performed for each first structure: in processing from the side close to the first silicon layer 210, the portion formed of the first silicon layer 210 is formed into the pre-structure, and then, in processing from the side close to the second silicon layer 230, the portion formed of the second silicon layer 230 is formed, and the portion formed of the first silicon layer 210 is formed from the pre-structure into the final shape. For each third structure, the pre-structure is formed from the side close to the first silicon layer 210, and then, the pre-structure is formed into the final shape from the side close to the second silicon layer 230. However, all of the first and third structures are not necessarily formed in this manner. Of the first and third structures, only the structure for which the positional precision between the portion processed from one side and the portion processed from the other side is required is subjected to the above-described method in which the pre-structure is formed from one side and the final shape is formed from the other side. For example, in the mirror device 100, the spring constant of each second hinge 5 as the first structure changes due to positional misalignment between the portion formed of the first silicon layer 210 and the portion formed of the second silicon layer 230, and for this reason, the positional precision between these two portions is required for each second hinge 5. On the other hand, a high positional precision is preferable for the base 1 as the first structure, but the performance of the mirror device 100 is not influenced even if the position of the portion formed of the first silicon layer 210 and the position of the portion formed of the second silicon layer 230 are misaligned from each other. Moreover, the third structure itself is formed of the first silicon layer 210, and does not include the second silicon layer 230. However, each of the movable inner comb electrode 62 and the movable outer comb electrode 72 as the third structures cooperates with a corresponding one of the fixed inner comb electrode 61 or the fixed outer comb electrode 71 formed of the second silicon layer 230, thereby generating electrostatic attractive force. For this reason, the movable inner comb electrode 62 and the movable outer comb electrode 72 need to exhibit a higher positional precision with respect to the structures formed of the second silicon layer 230 as compared to other third structures such as the mirror 2 and the first hinges 4. As described above, only one or more of the first and third structures requiring a high positional precision are formed by the above-described steps, i.e., the steps of forming the pre-structures into the final shapes. The remaining structures may be optionally formed by a simpler method.

Variations of the manufacturing method will be described below. Differences from the above-described manufacturing method will be mainly described below, and description of the steps similar to those of the above-described manufacturing method will not be repeated. FIGS. 18 to 24 are schematic cross-sectional views of the mirror device 100 along an A-A line of FIG. 1.

Figure 18:
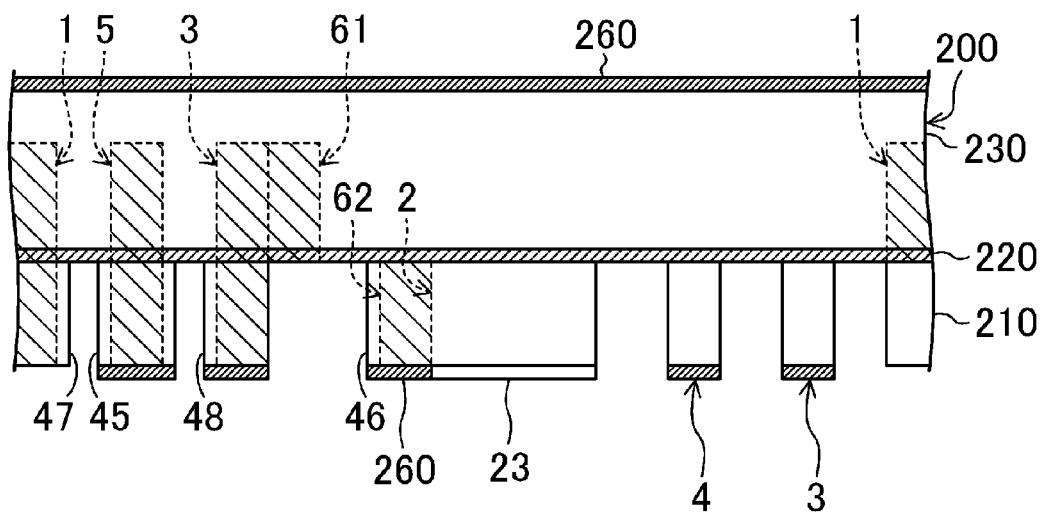
FIG. 18 is a cross-sectional view of the SOI substrate along an A-A line of FIG. 1 after the first etching step in a manufacturing method of a first variation.

In a manufacturing method of a first variation, when the SOI substrate 200 is etched from the side close to the first silicon layer 210, a pre-structure 45 as a portion of each second hinge 5 formed of the first silicon layer 210, a pre-structure 46 as the movable inner comb electrode 62, and a pre-structure (not shown) as the movable outer comb electrode 72 are formed in the first silicon layer 210 as illustrated in FIG. 18. Note that a portion of the base 1 facing the pre-structure 45 of each second hinge 5 and a portion of the frame body 3 facing the pre-structure 45 of each second hinge 5 are also formed respectively at pre-structures 47, 48. On the other hand, the portion (the intermediate portion of the first side portion 31 and the intermediate portion of the third side portion 33) of the frame body 3 formed only of the first silicon layer 210, the mirror 2, the first hinges 4, and a portion of the base 1 not facing the pre-structure 45 of each second hinge 5 and formed of the first silicon layer 210 are formed into the final shapes thereof at this step. Due to the relationship with other structures, the frame body 3 includes the portion formed into the pre-structure and the portion formed into the final shape. The frame body 3 further includes the portion not processed at the step of etching the SOI substrate 200 from the side close to the first silicon layer 210 and completely formed at the step of etching the SOI substrate 200 from the side close to the second silicon layer 230.

Note that in the manufacturing method of the variation, the step of decreasing the thickness of the oxide layer 220 as illustrated in FIG. 6C is not performed.

Figure 19:
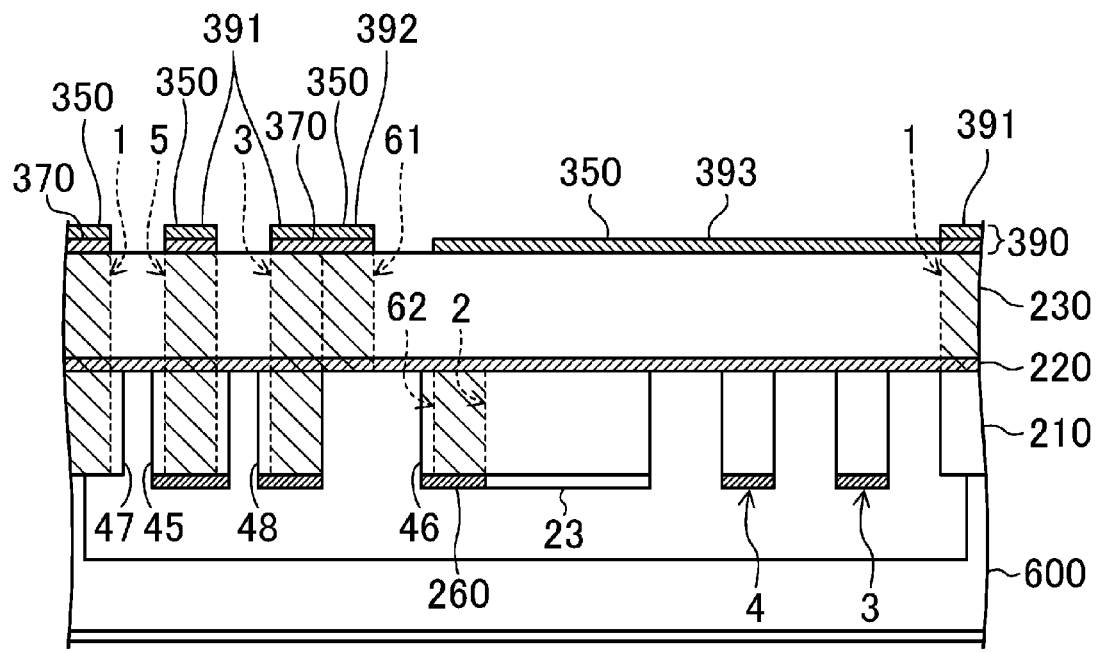
FIG. 19 is a cross-sectional view of the SOI substrate on which the final mask is formed.

Subsequently, when the SOI substrate 200 is etched from the side close to the second silicon layer 230, the final mask 390 is first formed as illustrated in FIG. 19. The final mask 390 includes the first mask 391 corresponding to the first structure, the second mask 392 corresponding to the second structure, and the third mask 393 corresponding to the third structure. The first mask 391 includes the oxide mask 370 and the fifth resist mask 350, and is formed in the shape corresponding to the final shape of the base 1 and the final shape of each second hinge 5. The second mask 392 includes the oxide mask 370 and the fifth resist mask 350, and is formed in the shape corresponding to the final shape of the fixed inner comb electrode 61. The third mask 393 does not include the oxide mask 370, but includes only the fifth resist mask 350. The third mask 393 covers at least the final shape of the first structure, and does not cover a portion of the pre-structure of the first structure protruding beyond the final shape thereof.

Figure 20:
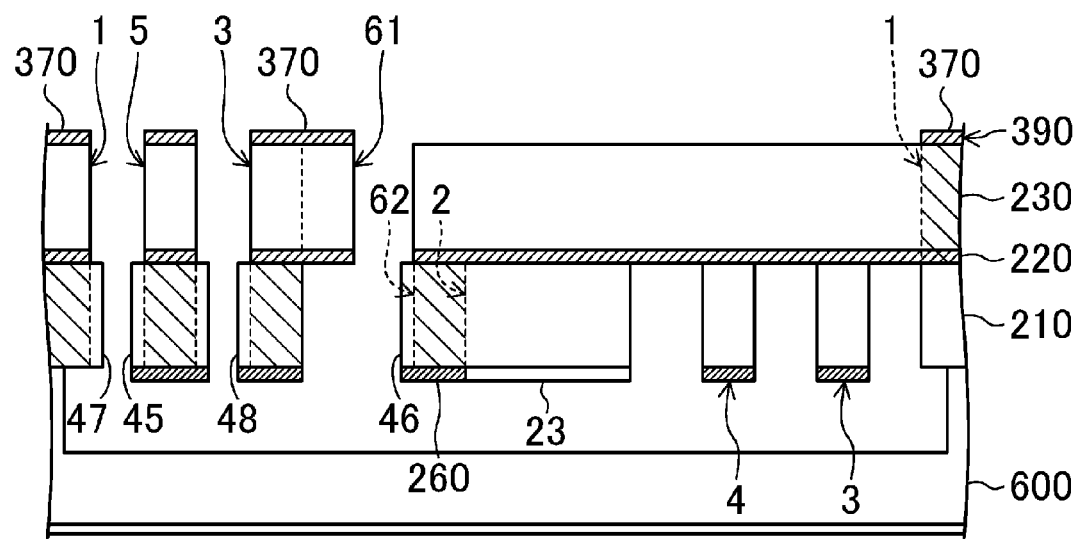
FIG. 20 is a cross-sectional view of the SOI substrate right before an unnecessary portion of the second silicon layer and the oxide layer and an unnecessary portion of the pre-structures are removed.
Figure 21:
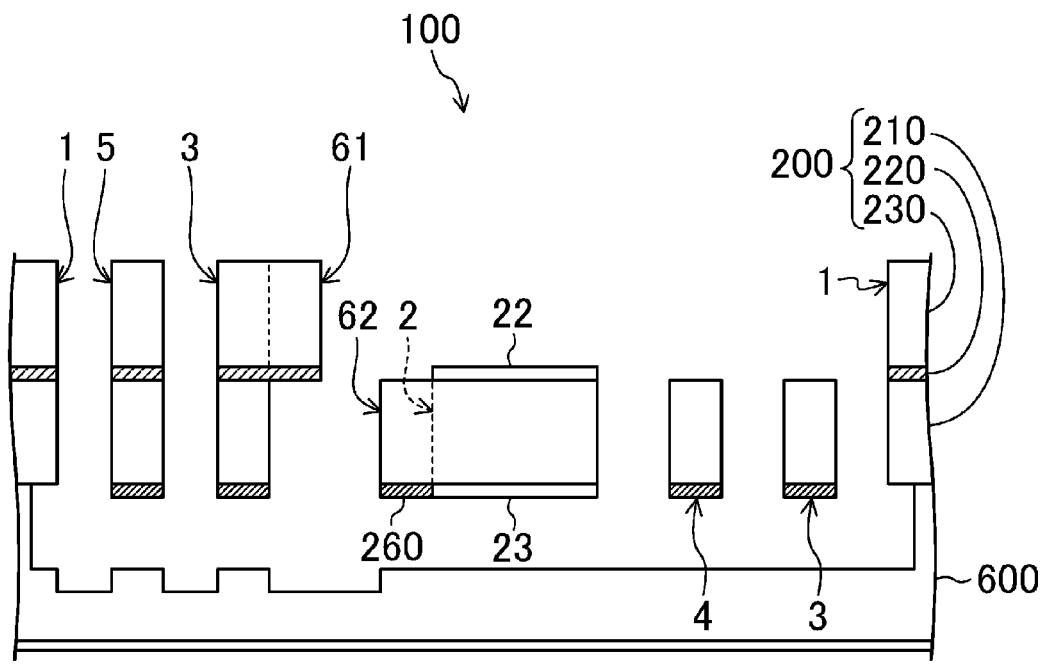
FIG. 21 is a cross-sectional view of the finished mirror device.

The second silicon layer 230 and the oxide layer 220 are etched using the final mask 390. First, a portion of the second silicon layer 230 exposed through the final mask 390 is ICP-etched. Subsequently, a portion of the oxide layer 220 exposed by the ICP etching is APS-etched. In this manner, a portion of the pre-structure protruding beyond the final shape thereof is exposed on the side close to the second silicon layer 230. Then, as illustrated in FIG. 20, the fifth resist mask 350 of the final mask 390 is detached. After the fifth resist mask 350 has been detached, a portion of the second silicon layer 230 not forming the second structure (the fixed inner comb electrode 61) and the third structure (the base 1, the frame body 3, and the second hinges 5) is exposed. Then, the second silicon layer 230 and the first silicon layer 210 are etched using the oxide mask 370. As a result, a portion of the second silicon layer 230 not forming the second and third structures is removed, and each of the pre-structures 45 to 48 of the first silicon layer 210 is formed into the final shape of a corresponding one of the structures. Note that at this point, the $SiO_2$ film 260 on the second hinges 5, the mirror 2, and the frame body 3 remains in the shape corresponding to the pre-structures.

Subsequently, the APS etching is performed to remove the oxide mask 370, the oxide layer 220 on the first structure (the mirror 2, the first hinges 4, the frame body 3, and the movable inner comb electrode 62), and a portion of the $SiO_2$ film 260 protruding beyond the final shapes of the mirror 2, the second hinges 5, and the frame body 3.

Subsequently, as in the above-described manufacturing method, the electrodes and the mirrored surface layer are formed, and the wires are connected to the electrodes by wire bonding. In this manner, the mirror device 100 is manufactured.

According to this manufacturing method, each second hinge 5 as the first structure and the movable inner comb electrode 62 and the movable outer comb electrode 72 as the third structures are formed as the pre-structures 45, 46 from the side close to the first silicon layer 210, and the final shapes of these structures are formed from the side close to the second silicon layer 230. Thus, each second hinge 5 is formed without misalignment between the portion formed of the first silicon layer 210 and the portion formed of the second silicon layer 230. Moreover, the movable inner comb electrode 62 is formed with a high positional precision with respect to the fixed inner comb electrode 61, and the movable outer comb electrode 72 is formed with a high positional precision with respect to the fixed outer comb electrode 71.

Of the third structures, the mirror 2, the frame body 3, and the first hinges 4 each requiring a lower positional precision than those of the movable inner comb electrode 62 and the movable outer comb electrode 72 are formed into the final shapes in processing from the side close to the first silicon layer 210. Note that the shape precision of the portion formed of the first silicon layer 210 is easily improved by etching from the side close to the first silicon layer 210. That is, in the above-described configuration in which the glass substrate 600 is joined to the SOI substrate 200 on the side close to the first silicon layer 210, heat tends to be accumulated between the SOI substrate 200 and the glass substrate 600 when the SOI substrate 200 is etched from the side close to the second silicon layer 230, and over-etching is easily caused. From the aspect of only the shape precision, e.g., the mirror 2 and the first hinges 4 formed of the first silicon layer 210 in the first variation are preferably formed by etching from the side close to the first silicon layer 210. Thus, in the case where the shape precision of the portion formed of the first silicon layer 210 is given priority over the positional precision between the portion formed of the second silicon layer 230 and the portion formed of the first silicon layer 210, the portion formed of the first silicon layer 210 is, as in the manufacturing method of the first variation, preferably formed into the final shape by etching from the side close to the first silicon layer 210.

On the other hand, in the case where the positional precision between the portion formed of the second silicon layer 230 and the portion formed of the first silicon layer 210 is given priority over the shape precision of the portion formed of the first silicon layer 210, a manufacturing method of a second variation as described below is preferable.

Figure 22:
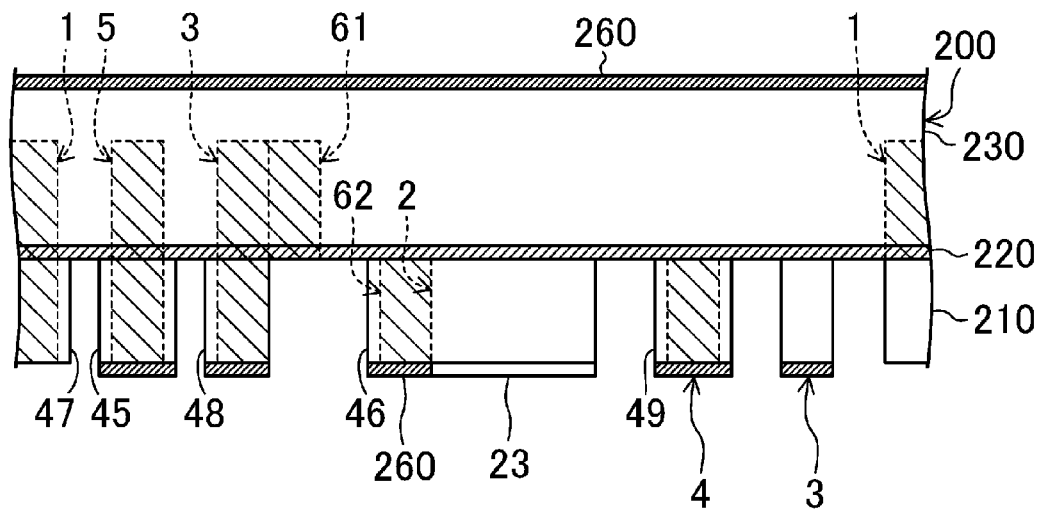
FIG. 22 is a cross-sectional view of the SOI substrate along the A-A line of FIG. 1 after the first etching step in a manufacturing method of a second variation.

In the manufacturing method of the second variation, when the SOI substrate 200 is etched from the side close to the first silicon layer 210, the pre-structure 45 as a portion of each second hinge 5 formed of the first silicon layer 210, the pre-structure 46 as the movable inner comb electrode 62, the pre-structure (not shown) as the movable outer comb electrode 72, and a pre-structure 49 as each first hinge 4 are formed in the first silicon layer 210 as illustrated in FIG. 22. Note that a portion of the base 1 facing the pre-structure 45 of each second hinge 5 and a portion of the frame body 3 facing the pre-structure 45 of each second hinge 5 are also formed respectively at the pre-structures 47, 48. On the other hand, the portion (the intermediate portion of the first side portion 31 and the intermediate portion of the third side portion 33) of the frame body 3 formed only of the first silicon layer 210, the mirror 2, and a portion of the base 1 not facing the pre-structure 45 of each second hinge 5 and formed of the first silicon layer 210 are formed into the final shapes at this step. The first hinges 4 are formed into the final shape in the first variation, whereas each first hinge 4 are formed as the pre-structure 49 in the second variation.

Figure 23:
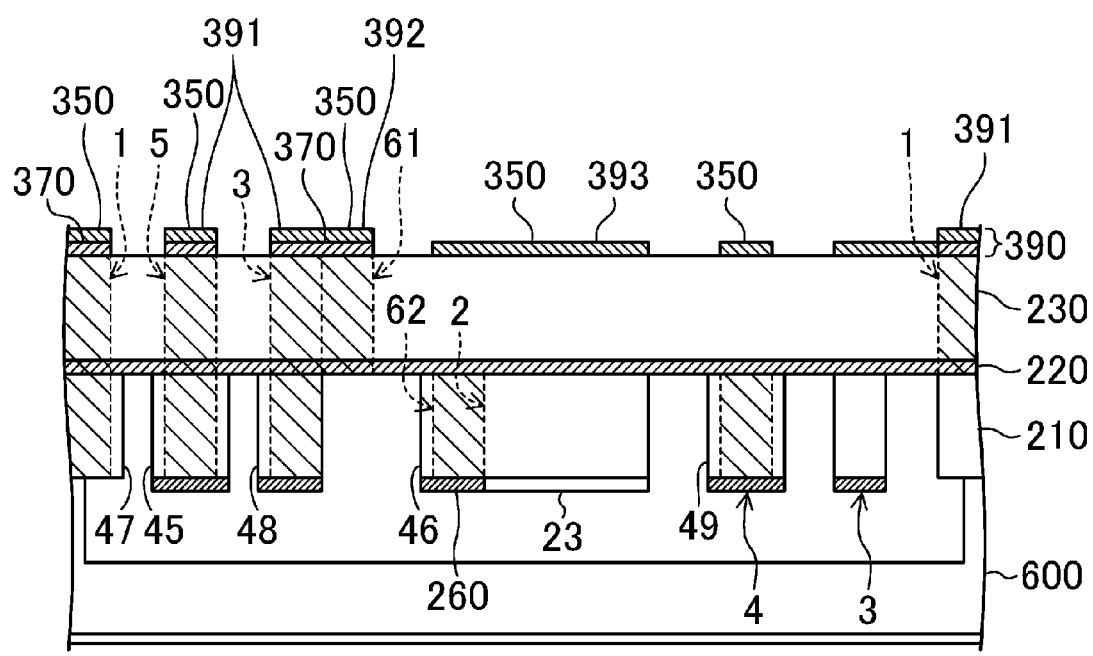
FIG. 23 is a cross-sectional view of the SOI substrate on which the final mask is formed.

Subsequently, when the SOI substrate 200 is etched from the side close to the second silicon layer 230, the final mask 390 is first formed as illustrated in FIG. 23. The final mask 390 includes the first mask 391 corresponding to the first structure, the second mask 392 corresponding to the second structure, and the third mask 393 corresponding to the third structure. The first mask 391 includes the oxide mask 370 and the fifth resist mask 350, and is formed in the shape corresponding to the final shape of the base 1 and the final shape of each second hinge 5. The second mask 392 includes the oxide mask 370 and the fifth resist mask 350, and is formed in the shape corresponding to the final shape of the fixed inner comb electrode 61. The third mask 393 does not include the oxide mask 370, but includes only the fifth resist mask 350. The third mask 393 covers at least the final shape of the first structure, and does not cover a portion of the pre-structure of the first structure protruding beyond the final shape thereof. The third mask 393 covers the space between the mirror 2 and each first hinge 4 in the first variation, whereas the space between the mirror 2 and each first hinge 4 is exposed through the third mask 393 in the second variation.

Figure 24:
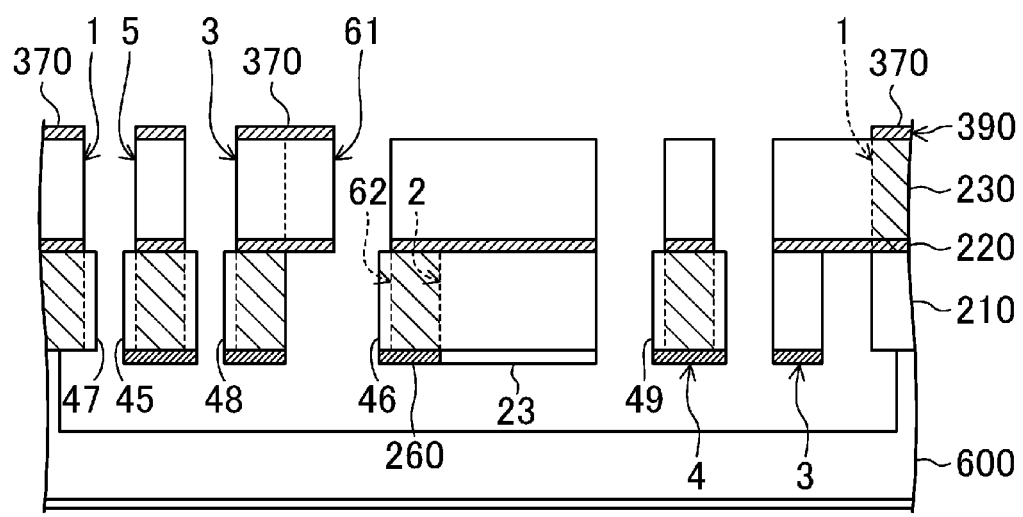
FIG. 24 is a cross-sectional view of the SOI substrate right before an unnecessary portion of the second silicon layer and the oxide layer and an unnecessary portion of the pre-structures are removed.

The second silicon layer 230 and the oxide layer 220 are etched using the final mask 390. First, a portion of the second silicon layer 230 exposed through the final mask 390 is ICP-etched. Subsequently, a portion of the oxide layer 220 exposed by the ICP etching is APS-etched. In this manner, a portion of each pre-structure protruding beyond the final shape thereof is exposed on the side close to the second silicon layer 230. Unlike the first variation, the second silicon layer 230 is etched along the outer edge of each first hinge 4. Then, as illustrated in FIG. 24, the fifth resist mask 350 of the final mask 390 is detached. After the fifth resist mask 350 has been detached, a portion of the second silicon layer 230 not forming the second structure (the fixed inner comb electrode 61) and the third structure (the base 1, the frame body 3, and the second hinges 5) is exposed. Then, the second silicon layer 230 and the first silicon layer 210 are etched using the oxide mask 370. As a result, the portion of the second silicon layer 230 not forming the second structure and the third structure is removed, and each of the pre-structures 45 to 49 of the first silicon layer 210 is formed into the final shape of a corresponding one of the structures. Note that at this point, the $SiO_2$ film 260 on the mirror 2, the first hinges 4, the second hinges 5, and the frame body 3 remains in the shape corresponding to the pre-structures.

Subsequently, the APS etching is performed to remove the oxide mask 370, the oxide layer 220 on the first structure (the mirror 2, the first hinges 4, the frame body 3, and the movable inner comb electrode 62), and a portion of the $SiO_2$ film 260 protruding beyond the final shapes of the mirror 2, the first hinges 4, the second hinges 5, and the frame body 3.

Subsequently, as in the above-described manufacturing method, the electrodes and the mirrored surface layer are formed, and the wires are connected to the electrodes by wire bonding. In this manner, the mirror device 100 is manufactured.

According to this manufacturing method, each second hinge 5 as the first structure and each first hinge 4, the movable inner comb electrode 62, and the movable outer comb electrode 72 as the third structures are formed as the pre-structures 45, 46, 49 from the side close to the first silicon layer 210, and the final shapes of these structures are formed from the side close to the second silicon layer 230. Thus, each second hinge 5 is formed without misalignment between the portion formed of the first silicon layer 210 and the portion formed of the second silicon layer 230. Moreover, the movable inner comb electrode 62 is formed with a high positional precision with respect to the fixed inner comb electrode 61, and the movable outer comb electrode 72 is formed with a high positional precision with respect to the fixed outer comb electrode 71. In addition, each first hinge 4 is formed with a high positional precision with respect to the structure (e.g., the base 1) formed of the second silicon layer 230.

That is, as in the manufacturing method of the first variation, when the SOI substrate 200 is processed from the side close to the first silicon layer 210, the portion formed of the first silicon layer 210 is formed into the final shape thereof. Thus, the shape precision of such a portion can be improved. On the other hand, as in the manufacturing method of the second variation, the portion formed of the first silicon layer 210 is formed into the pre-structures when the SOI substrate 200 is processed from the side close to the first silicon layer 210, and the pre-structures are formed into the final shapes thereof when the SOI substrate 200 is processed from the side close to the second silicon layer 230. Thus, the positional precision between these portions can be improved.

Advantageous Effects

Thus, the above-described method for manufacturing the electronic component includes the first etching step of etching the SOI substrate 200 from the side close to the first silicon layer 210, the mask formation step of forming the final mask 390 on the side of the SOI substrate 200 close to the second silicon layer 230, and the second etching step of etching, using the final mask 390, the SOI substrate 200 from the side close to the second silicon layer 230. The structure includes the first structure, such as the second hinges 5, formed of the first silicon layer 210 and the second silicon layer 230. At the first etching step, a portion of each second hinge 5 formed of the first silicon layer 210 is formed as the second-hinge pre-structure 42 having a larger shape than the final shape. At the mask formation step, the first mask 391 corresponding to the final shape of each second hinge 5 is formed on the side of the SOI substrate 200 close to the second silicon layer 230 in the second-hinge pre-structure 42 as viewed in the thickness direction of the SOI substrate 200. At the second etching step, the second silicon layer 230 and the second-hinge pre-structure 42 are, using the first mask 391, etched to form the final shape of each second hinge 5.

According to the above-described configuration, in the case of processing the SOI substrate 200 from each side thereof, when the SOI substrate 200 is processed from the side close to the first silicon layer 210, the portion formed of the first silicon layer 210 is not processed into the final shape, but is formed into the pre-structure larger than the final shape. When the SOI substrate 200 is processed from the side close to the second silicon layer 230, the second silicon layer 230 and the pre-structure are together processed to form the first structure. Since the shape of the first structure is finally determined at the second etching step, the first structure can be precisely formed even with misalignment between the position in processing of the SOI substrate 200 from the side close to the first silicon layer 210 and the position in processing of the SOI substrate 200 from the side close to the second silicon layer 230. Moreover, since the first mask 391 is placed in the pre-structure as viewed in the thickness direction of the SOI substrate 200, the first structure can be more precisely formed.

The structure includes the second structure, such as the fixed inner comb electrode 61, not including the first silicon layer 210 and formed of the second silicon layer 230. At the first etching step, a portion of the first silicon layer 210 facing the fixed inner comb electrode 61 is etched to form the recess R at the first silicon layer 210. At the mask formation step, the second mask 392 corresponding to the final shape of the fixed inner comb electrode 61 is formed on the side of the SOI substrate 200 close to the second silicon layer 230 in the recess R as viewed in the thickness direction of the SOI substrate 200. At the second etching step, the second silicon layer 230 is, using the second mask 392, etched to form the final shape of the fixed inner comb electrode 61.

According to the above-described configuration, the second structure can be formed at a portion of the second silicon layer 230 from which an opposing portion of the first silicon layer 210 is removed. Thus, the second structure not including the first silicon layer 210 can be formed.

At the mask formation step, the first mask 391 and the second mask 392 are formed using the photomask 352 defining the positional relationship between the first mask 391 and the second mask 392.

According to the above-described configuration, when the position of the photomask 352 is displaced, the positions of the first mask 391 and the second mask 392 are both displaced. As a result, the positional relationship between the first and second structures can be maintained.

The SOI substrate 200 includes the oxide layer 220 provided between the first silicon layer 210 and the second silicon layer 230. The structure includes the third structure, such as the mirror 2 and the movable inner comb electrode 62, not including the second silicon layer 230 and formed of the first silicon layer 210. At the first etching step, a portion of the mirror 2 formed of the first silicon layer 210 and a portion of the movable inner comb electrode 62 formed of the first silicon layer 210 are formed as the mirror pre-structure 43 and the movable-comb pre-structure 44 having a larger shape than the final shapes. At the mask formation step, the third mask 393 corresponding to the final shapes of the mirror 2 and the movable inner comb electrode 62 is formed on the side of the SOI substrate 200 close to the second silicon layer 230 in the mirror pre-structure 43 and the movable-comb pre-structure 44 as viewed in the thickness direction of the SOI substrate 200. At the second etching step, the second silicon layer 230 and the oxide layer 220 are, using the third mask 393, etched such that a portion of the oxide layer 220 on the mirror pre-structure 43 and the movable-comb pre-structure 44 is formed into the shape corresponding to the final shapes of the mirror 2 and the movable inner comb electrode 62. Then, the third mask 393 is detached, and the mirror pre-structure 43 and the movable-comb pre-structure 44 are, using a portion of the oxide layer 220 remaining on the mirror pre-structure 43 and the movable-comb pre-structure 44, etched to form the final shapes of the mirror 2 and the movable inner comb electrode 62.

According to the above-described configuration, even the third structure not including the second silicon layer 230 is determined by the second etching step of processing the SOI substrate 200 from the side close to the second silicon layer 230. As in the first structure, the third structure can be precisely formed in such a manner that the first silicon layer 210 is, at the first etching step, formed into the pre-structure having a larger shape than the final shape of the third structure and that the third mask 393 is, at the mask formation step, formed in the pre-structure as viewed in the thickness direction of the mirror device 100.

For the substrate configured such that another layer (the oxide layer 220) is interposed between the first silicon layer 210 and the second silicon layer 230 as described above, it might be required that the substrate is processed from each side thereof. In this case, the above-described manufacturing method is effective, and each structure can be precisely formed.

Each of the first and second masks 391, 392 includes the oxide mask 370 formed on the second silicon layer 230, and the fifth resist mask 350 formed on the oxide mask 370. At the second etching step, the second silicon layer 230 and the oxide layer 220 are, using the fifth resist masks 350 of the first and second masks 391, 392 and the third mask 393, etched such that a portion of the first structure formed of the second silicon layer 230 and the oxide layer 220 and the second structure are formed into the final shapes thereof and that a portion of the second silicon layer 230 and the oxide layer 220 on the third pre-structure is formed into the shape corresponding to the final shape of the third structure. Then, the fifth resist masks 350 of the first and second masks 391, 392 and the third mask 393 are detached, and a portion of the second silicon layer 230 on the mirror pre-structure 43 and the movable-comb pre-structure 44, the mirror pre-structure 43, and the movable-comb pre-structure 44 are, using the oxide masks 370 of the first and second masks 391, 392 and a portion of the oxide layer 220 remaining on the third structure, etched to form the final shape of the first structure and the final shape of the third structure.

According to the above-described configuration, in the case of the substrate including the first silicon layer 210, the oxide layer 220, and the second silicon layer 230, the third structure is formed using the oxide layer 220 as a mask at the second etching step. Since each of the first and second masks 391, 392 has the double structure of the oxide mask 370 and the fifth resist mask 350, the oxide layer 220 can be formed into a desired shape, and can be used as a mask.

At the mask formation step, the first mask 391, the second mask 392, and the third mask 393 are formed using the photomask 352 defining the positional relationship among the first mask 391, the second mask 392, and the third mask 393.

According to the above-described configuration, if the position of the photomask 352 is displaced, the positions of the first mask 391, the second mask 392, and the third mask 393 are also displaced. As a result, the positional relationship between the first and third structures can be maintained, and the positional relationship between the second and third structures can be maintained.

Other Embodiments

The embodiments have been described above as example techniques of the present disclosure. However, the techniques of the present disclosure are not limited to the embodiments described above, and are applicable to embodiments to which modifications, substitutions, additions, or omissions are made. Moreover, the components described in the above-described embodiments may be combined into another embodiment. Elements illustrated in the attached drawings or the detailed description may include not only essential elements for solving the problem, but also non-essential elements for solving the problem in order to illustrate the above-described techniques. Thus, the mere fact that those non-essential elements are shown in the attached drawings or the detailed description should not be interpreted as requiring that such elements be essential.

The above-described embodiments may have the following configurations.

The mirror device 100 is an example of an electronic device, and the electronic device to which the above-described manufacturing method is applicable is not limited to the mirror device 100. Moreover, the configuration of the mirror device 100 has been set forth merely as an example, and the present disclosure is not limited to such a configuration. Further, the first to third structures have been set forth merely as examples.

In the above-described manufacturing method, etching and film formation has been specifically described, but the present disclosure is not limited to such etching and film formation. That is, as long as the above-described manufacturing method can be implemented, the type of etching is not limited, and the film formation method is not limited. Moreover, the resist mask may be a positive resist or a negative resist. The materials and shapes described in the above-described embodiments have been set forth as examples, and the present disclosure is not limited to such materials and shapes.

In the above-described manufacturing method, the SOI substrate is used as a substrate, but the present disclosure is not limited to the SOI substrate. As long as a substrate includes two or more layers, the above-described manufacturing method is applicable to such a substrate.

As long as an electronic component can be manufactured, the order of the steps of the above-described manufacturing method may be changed, or any of the steps of the above-described manufacturing method may be skipped.

In the above-described embodiments, manufacturing of the electronic component in the case where the position of the final mask 390 is displaced due to positional displacement caused when the photomask 352 is placed using the second alignment mark 231 has been described. However, the mechanism of causing positional displacement is not limited to this case. With a change in the method for forming the final mask 390, the mechanism of causing positional displacement of the final mask 390 also changes, for example. The above-described manufacturing method is not limited to the method for forming the final mask 390 and the mechanism of causing positional displacement of the final mask 390. The above-described manufacturing method is broadly effective against misalignment between the position in processing of the substrate from one side thereof and the position in processing of the substrate from the other side thereof.

What is claimed is:

1. A method for manufacturing an electronic component, in which a substrate including at least first and second layers is etched to form a structure, comprising:
   a first etching step of etching the substrate from the first layer side;
   a mask formation step of forming a mask on the second layer side of the substrate; and
   a second etching step of etching, using the mask, the substrate from the second layer side,
   wherein at the first etching step, a portion of the structure formed of the first layer is formed as a pre-structure having a larger shape than a final shape,
   at the mask formation step, a mask corresponding to the final shape is formed on the second layer side of the substrate in the pre-structure as viewed in a thickness direction of the substrate, and
   at the second etching step, the second layer and the pre-structure are, using the mask corresponding to the final shape, etched to form the final shape.

2. The method of claim 1, wherein
   the structure includes a first structure formed of the first and second layers,
   at the first etching step, a portion of the first structure formed of the first layer is formed as a first pre-structure having a larger shape than a final shape,
   at the mask formation step, a first mask corresponding to the final shape of the first structure is formed on the second layer side of the substrate in the first pre-structure as viewed in the thickness direction of the substrate, and
   at the second etching step, the second layer and the first pre-structure are, using the first mask, etched to form the final shape of the first structure.

3. The method of claim 2, wherein
the structure includes a second structure not including the first layer and formed of the second layer,
at the first etching step, a portion of the first layer facing the second structure is etched to form a recess at the first layer,
at the mask formation step, a second mask corresponding to a final shape of the second structure is formed on the second layer side of the substrate in the recess as viewed in the thickness direction of the substrate, and
at the second etching step, the second layer is, using the second mask, etched to form the final shape of the second structure.

4. The method of claim 3, wherein
at the mask formation step, the first and second masks are formed using a photomask defining a positional relationship between the first and second masks.

5. The method of claim 2, wherein
the electronic component includes a base, a movable portion configured to move on the base, and a connection portion configured to elastically connect between the movable portion and the base, and
the connection portion includes the first structure.

6. The method of claim 1, wherein
the structure includes a third structure not including the second layer and formed of the first layer,
at the first etching step, a portion of the third structure formed of the first layer is formed as a third pre-structure having a larger shape than a final shape,
at the mask formation step, a third mask corresponding to the final shape of the third structure is formed on the second layer side of the substrate in the third pre-structure as viewed in the thickness direction of the substrate, and
at the second etching step, the second layer and the third pre-structure are, using the third mask, etched to form the final shape of the third structure.

7. The method of claim 6, wherein
the substrate includes a third layer provided between the first and second layers, and at the second etching step,
the second and third layers are, using the third mask, etched such that a portion of the third layer on the third pre-structure is formed into a shape corresponding to the final shape of the third structure, and then, the third mask is detached, and the third pre-structure is, using a portion of the third layer remaining on the third pre-structure, etched to form the final shape of the third structure.

8. The method of claim 7, wherein
the structure includes a first structure formed of the first and second layers,
at the first etching step, a portion of the first structure formed of the first layer is formed as a first pre-structure having a larger shape than a final shape,
at the mask formation step, a first mask corresponding to the final shape of the first structure is formed on the second layer side of the substrate in the first pre-structure as viewed in the thickness direction of the substrate,
the first mask includes a lower mask formed on the second layer, and an upper mask formed on the lower mask,
at the second etching step,
the second and third layers are, using the upper mask of the first mask and the third mask, etched such that a portion of the first structure formed of the second and third layers is formed into a final shape thereof and that a portion of the second and third layers on the third pre-structure is formed into a shape corresponding to the final shape of the third structure, and then,
the upper mask of the first mask and the third mask are detached, and a portion of the second layer on the third pre-structure and the third pre-structure are, using the lower mask of the first mask and a portion of the third layer remaining on the third structure, etched to form the final shape of the first structure and the final shape of the third structure.

9. The method of claim 8, wherein
at the mask formation step, the first and third masks are formed using a photomask defining a positional relationship between the first and third masks.

10. The method of claim 6, wherein
the electronic component includes a first comb electrode with a plurality of electrode fingers, and a second comb electrode with a plurality of electrode fingers, the electrode fingers of the first and second comb electrodes being alternately arranged,
the first comb electrode includes a second structure not including the first layer and formed of the second layer, and
the second comb electrode includes the third structure.

* * * * *